United States Patent
Anada et al.

(10) Patent No.: US 9,960,067 B2
(45) Date of Patent: May 1, 2018

(54) ELECTROSTATIC CHUCK

(71) Applicant: TOTO LTD., Kitakyushu-shi, Fukuoka (JP)

(72) Inventors: Kazuki Anada, Fukuoka-ken (JP); Yuichi Yoshii, Fukuoka-ken (JP)

(73) Assignee: Toto Ltd., Fukuoka (JP)

( * ) Notice: Subject to any disclaimer, the term of this patent is extended or adjusted under 35 U.S.C. 154(b) by 174 days.

(21) Appl. No.: 14/777,879

(22) PCT Filed: Mar. 27, 2014

(86) PCT No.: PCT/JP2014/059002
§ 371 (c)(1),
(2) Date: Sep. 17, 2015

(87) PCT Pub. No.: WO2014/157571
PCT Pub. Date: Oct. 2, 2014

(65) Prior Publication Data
US 2016/0276198 A1    Sep. 22, 2016

(30) Foreign Application Priority Data

Mar. 29, 2013   (JP) ................... 2013-072121
Mar. 29, 2013   (JP) ................... 2013-072122
Mar. 26, 2014   (JP) ................... 2014-064870

(51) Int. Cl.
*H01L 21/683*    (2006.01)
*H01L 21/67*    (2006.01)

(52) U.S. Cl.
CPC .... *H01L 21/6833* (2013.01); *H01L 21/67109* (2013.01); *H01L 21/6831* (2013.01); *Y10T 279/23* (2015.01)

(58) Field of Classification Search
CPC ............... H01L 21/683; H01L 21/6831; H01L 21/6833; H01L 21/68757; H02N 13/00; Y10T 279/23
See application file for complete search history.

(56) References Cited

U.S. PATENT DOCUMENTS 5,542,559 A * 8/1996 Kawakami .......... H01L 21/6838
 118/723 E
5,720,818 A * 2/1998 Donde ................ C23C 16/4586
 118/500

(Continued)

FOREIGN PATENT DOCUMENTS

JP    H10-50813 A    2/1998
JP    2003-338492 A    11/2003

(Continued)

*Primary Examiner* — Eric A Gates
(74) *Attorney, Agent, or Firm* — Carrier Blackman & Associates, P.C.; William D. Blackman; Jingli Wang

(57) ABSTRACT

According to an aspect of an embodiment of the invention, there is provided an electrostatic chuck including: a ceramic dielectric substrate including a first major surface for mounting a clamped target, a second major surface on opposite side from the first major surface, and a through hole provided from the second major surface to the first major surface; a metallic base plate supporting the ceramic dielectric substrate and including a gas feed channel communicating with the through hole; and an insulator plug including a ceramic porous body provided in the gas feed channel and a ceramic insulating film provided between the ceramic porous body and the gas feed channel and being denser than the ceramic porous body, the ceramic insulating film biting into the ceramic porous body from a surface of the ceramic porous body.

21 Claims, 20 Drawing Sheets

(56) References Cited

U.S. PATENT DOCUMENTS

| | | | |
|---|---|---|---|
| 5,904,776 A | 5/1999 | Donde et al. | |
| 6,108,189 A * | 8/2000 | Weldon | C23C 16/4586 279/128 |
| 7,651,571 B2 * | 1/2010 | Migita | C23C 16/4586 118/728 |
| 8,358,493 B2 * | 1/2013 | Kugimoto | H01L 21/6831 252/520.5 |
| 8,573,151 B2 * | 11/2013 | Ohmi | H01J 37/32192 118/723 MW |
| 9,165,813 B2 | 10/2015 | Kataigi et al. | |
| 2004/0190215 A1 | 9/2004 | Weldon et al. | |
| 2005/0042881 A1 * | 2/2005 | Nishimoto | H01L 21/6833 438/710 |
| 2005/0105243 A1 * | 5/2005 | Lee | H01L 21/6833 361/234 |
| 2012/0248715 A1 | 10/2012 | Kondo et al. | |

FOREIGN PATENT DOCUMENTS

| | | |
|---|---|---|
| JP | 2005-268654 A | 9/2005 |
| JP | 2010-123712 | 6/2010 |
| JP | 2013-232640 A | 11/2013 |
| WO | 2008/099789 A1 | 8/2008 |

\* cited by examiner

| INSULATING FILM MATERIAL | METHOD | INSULATION BREAKDOWN VOLTAGE (TYPICAL VALUE) | THICKNESS |
|---|---|---|---|
| CERAMIC | SPRAYING | 5.3 ~ 7.7 kV/mm | 0.05~0.5mm |
| SPACE | | 1 kV/mm | ~10mm |

(×10⁻⁶/°C)

| Al$_2$O$_3$ (ALUMINA) | 7.0 |
| Y$_2$O$_3$ | 7.2 |
| TiC-TiN | 7.4 |
| Al$_2$O$_3$ (SAPPHIRE) | 7.7 |
| MgO-SiO$_2$ | 7.7 |
| 2MgO-SiO$_2$ | 10.0 |

ELECTROSTATIC CHUCK

TECHNICAL FIELD

Embodiments of the invention relate generally to an electrostatic chuck and an electrostatic chuck which can enhance the insulation breakdown voltage of a ceramic dielectric substrate.

BACKGROUND ART

A ceramic electrostatic chuck is fabricated by sandwiching an electrode between ceramic dielectric substrates made of e.g. alumina, followed by firing. An electrostatic clamping force is applied to the incorporated electrode. Thus, the electrostatic chuck clamps a substrate such as a silicon wafer by electrostatic force. In such an electrostatic chuck, an inert gas such as helium (He) is passed between the front surface of the ceramic dielectric substrate and the back surface of the clamped target substrate to control the temperature of the clamped target substrate.

For instance, the temperature increase of the substrate may be associated with processing in an apparatus for processing a substrate such as a CVD (chemical vapor deposition) apparatus, sputtering apparatus, ion implantation apparatus, and etching apparatus. In the electrostatic chuck used in such an apparatus, an inert gas such as He is passed between the ceramic dielectric substrate and the clamped target substrate to bring the substrate into contact with the inert gas. Thus, the temperature increase of the substrate is suppressed.

In the electrostatic chuck for controlling the substrate temperature with an inert gas such as He, a hole (gas feed channel) for feeding an inert gas such as He is provided in the ceramic dielectric substrate and a base plate for supporting the ceramic dielectric substrate.

Here, electric discharge may occur in the gas feed channel when the substrate is processed in the apparatus. Patent Literature 1 discloses an electrostatic chuck in which the insulation performance in the gas feed channel is improved by providing a ceramic sintered porous body in the gas feed channel. The structure and the film hole of the ceramic sintered porous body are used as a gas flow channel. Patent Literature 2 discloses an electrostatic chuck in which a discharge prevention member of the processing gas flow channel made of a ceramic porous body and intended for preventing discharge is provided in the gap for gas diffusion. Patent Literature 3 discloses an electrostatic chuck in which arc discharge is reduced by providing a dielectric insert made of a porous dielectric such as alumina.

However, a sufficient insulation breakdown voltage cannot be achieved simply by providing a ceramic porous body in the gas feed channel. Further enhancement of insulation breakdown voltage is needed to provide an electrostatic chuck supporting various conditions in the processing apparatus.

Furthermore, the porous body has high porosity. Thus, the heat transfer coefficient from the ceramic porous body to the ceramic dielectric substrate is lower than the heat transfer coefficient from the metallic base plate to the ceramic dielectric substrate. Thus, the temperature difference is likely to increase between the temperature of the substrate cooled by a conduction gas passed from the gas feed channel and the temperature of the substrate with no conduction gas passed. That is, regions with a large within-wafer temperature difference (what is called hot spots and cold spots) occur near the ceramic porous body throughout the substrate. This causes the problem of failing to perform temperature control with high wafer temperature uniformity.

CITATION LIST

Patent Literature

[PTL 1] JP 2010-123712 A (Kokai)
[PTL 2] JP 2003-338492 A (Kokai)
[PTL 3] JP H10-50813 A (Kokai)

SUMMARY OF INVENTION

Technical Problem

The invention has been made based on the recognition of the foregoing problems. An object of the invention is to provide an electrostatic chuck capable of achieving high insulation breakdown voltage against discharge in the gas feed channel. Another object of the invention is to provide an electrostatic chuck capable of performing temperature control with high wafer temperature uniformity on the clamped target even in the structure in which a ceramic porous body is provided in the gas feed channel.

Solution to Problem

According to an aspect of an embodiment of the invention, there is provided an electrostatic chuck including: a ceramic dielectric substrate including a first major surface for mounting a clamped target, a second major surface on opposite side from the first major surface, and a through hole provided from the second major surface to the first major surface; a metallic base plate supporting the ceramic dielectric substrate and including a gas feed channel communicating with the through hole; and an insulator plug including a ceramic porous body provided in the gas feed channel and a ceramic insulating film provided between the ceramic porous body and the gas feed channel and being denser than the ceramic porous body, the ceramic insulating film biting into the ceramic porous body from a surface of the ceramic porous body.

DESCRIPTION OF EMBODIMENTS

Figure 1:
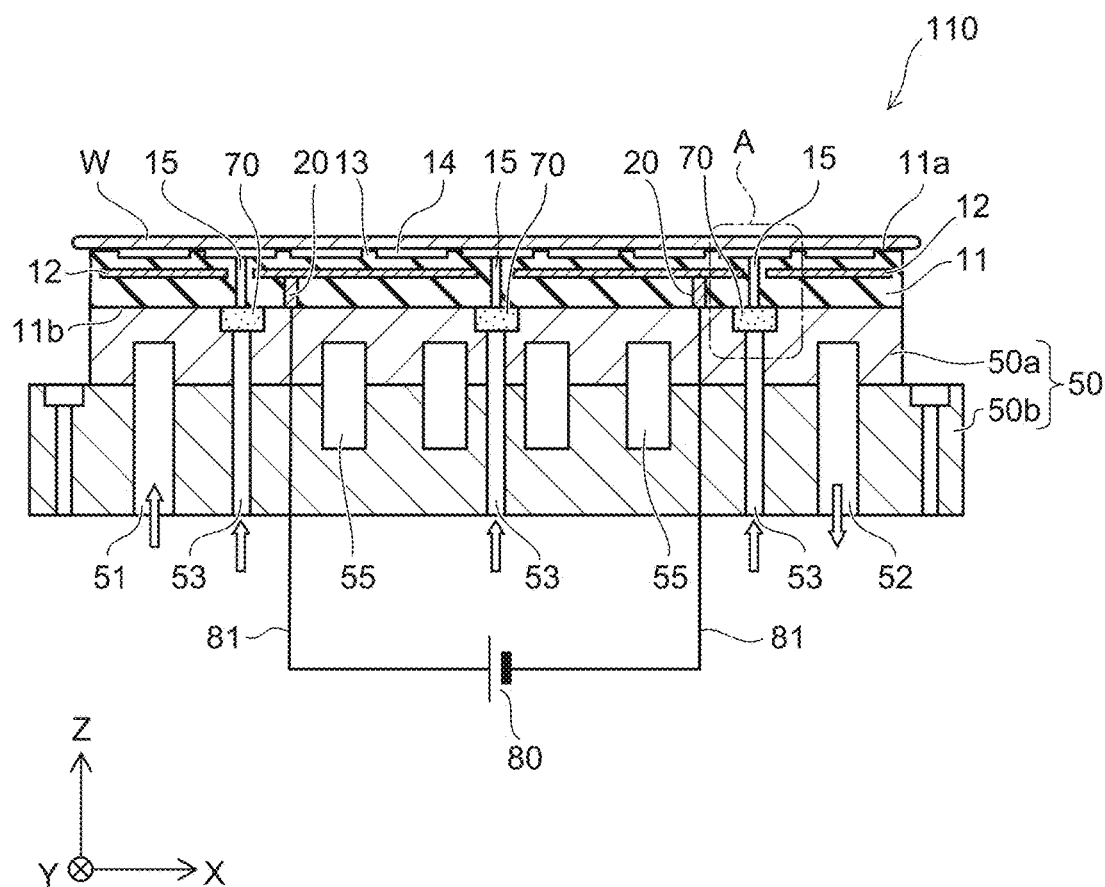
FIG. 1 is a schematic sectional view illustrating a configuration of an electrostatic chuck according to this embodiment.

A first aspect of the invention is an electrostatic chuck comprising: a ceramic dielectric substrate including a first major surface for mounting a clamped target, a second major surface on opposite side from the first major surface, and a through hole provided from the second major surface to the first major surface; a metallic base plate supporting the ceramic dielectric substrate and including a gas feed channel communicating with the through hole; and an insulator plug including a ceramic porous body provided in the gas feed channel and a ceramic insulating film provided between the ceramic porous body and the gas feed channel and being denser than the ceramic porous body. The ceramic insulating film bites into the ceramic porous body from a surface of the ceramic porous body.

This electrostatic chuck can enhance the insulation breakdown voltage in the through hole and the gas feed channel by not only the ceramic porous body but also the ceramic insulating film provided in the gas feed channel.

Furthermore, no heat insulating layer exists at the boundary surface between the ceramic porous body and the ceramic insulating film. Thus, the temperature distribution of the target is made uniform. This can suppress the occurrence of what is called hot spots in the target on the through hole. Furthermore, the insulating breakdown voltage can be enhanced by suppressing peeling of the ceramic insulating film from the ceramic porous body. Furthermore, sealing of the ceramic porous body is suppressed. This can suppress the decrease of the flow rate of the gas.

A second aspect of the invention is an electrostatic chuck according to the first aspect of the invention, wherein thermal expansion coefficient of the ceramic insulating film is equal to each of thermal expansion coefficient of the ceramic porous body and thermal expansion coefficient of the ceramic dielectric substrate.

In this electrostatic chuck, no heat insulating layer exists at the boundary surface between the ceramic porous body and the ceramic insulating film. Thus, the temperature distribution of the target is made uniform. This can suppress the occurrence of what is called hot spots in the target on the through hole. Furthermore, the insulating breakdown voltage can be enhanced by suppressing peeling of the ceramic insulating film from the ceramic porous body. Furthermore, sealing of the ceramic porous body is suppressed. This can suppress the decrease of the flow rate of the gas.

A third aspect of the invention is an electrostatic chuck according to the first aspect of the invention, wherein arithmetic average roughness of a surface of the ceramic insulating film is smaller than arithmetic average roughness of the surface of the ceramic porous body and larger than arithmetic average roughness of a surface of the ceramic dielectric substrate.

In this electrostatic chuck, no heat insulating layer exists at the boundary surface between the ceramic porous body and the ceramic insulating film. Thus, the temperature distribution of the target is made uniform. This can suppress the occurrence of what is called hot spots in the target on the through hole. Furthermore, the insulating breakdown voltage can be enhanced by suppressing peeling of the ceramic insulating film from the ceramic porous body. Furthermore, sealing of the ceramic porous body is suppressed. This can suppress the decrease of the flow rate of the gas.

A fourth aspect of the invention is an electrostatic chuck according to the first aspect of the invention, wherein porosity of the ceramic insulating film is 10 percent or less, and porosity of the ceramic porous body is 30 percent or more and 60 percent or less.

In this electrostatic chuck, the ceramic insulating film serves as a stress relaxation layer.

A fifth aspect of the invention is an electrostatic chuck according to the first aspect of the invention, wherein density of the ceramic insulating film is 3.0 grams per cubic centimeter or more and 4.0 grams per cubic centimeter or less, and density of the ceramic porous body is 1.5 grams per cubic centimeter or more and 3.0 grams per cubic centimeter or less.

In this electrostatic chuck, the ceramic insulating film serves as a stress relaxation layer.

A sixth aspect of the invention is an electrostatic chuck according to the first aspect of the invention, wherein ratio of difference between thermal expansion coefficient of the ceramic porous body and thermal expansion coefficient of the ceramic insulating film with reference to the thermal expansion coefficient of the ceramic porous body is 100% or less.

This electrostatic chuck can suppress the destruction of the ceramic porous body and the ceramic insulating film and maintain stable cooling performance during the process.

A seventh aspect of the invention is an electrostatic chuck according to the first aspect of the invention, wherein thermal expansion coefficient of each of the ceramic porous body and the ceramic insulating film is $7.0 \times 10^{-6}/°$ C. or more and $10.0 \times 10^{-6}/°$ C. or less.

This electrostatic chuck can suppress the destruction of the ceramic porous body and the ceramic insulating film and maintain stable cooling performance during the process.

An eighth aspect of the invention is an electrostatic chuck according to the first aspect of the invention, wherein thermal conductivity of each of the ceramic porous body and the ceramic insulating film is 0.3 watts per meter kelvin or more and 10 watts per meter kelvin or less.

In this electrostatic chuck, the temperature distribution of the target is made uniform. This can suppress the occurrence of what is called hot spots in the target on the through hole.

A ninth aspect of the invention is an electrostatic chuck according to the third aspect of the invention, wherein the arithmetic average roughness of the surface of the ceramic insulating film is 0.5 micrometers or more and 4 micrometers or less, and the arithmetic average roughness of the surface of the ceramic porous body is 5 micrometers or more and 20 micrometers or less.

In this electrostatic chuck, the ceramic insulating film having a structure moderately containing air serves as a stress relaxation layer.

A tenth aspect of the invention is an electrostatic chuck according to the first aspect of the invention, wherein the ceramic insulating film is a ceramic sprayed film provided on a side surface of the ceramic porous body.

In this electrostatic chuck, the ceramic insulating film is a ceramic sprayed film. Thus, high insulation performance can be achieved by the insulator plug including the ceramic porous body and the ceramic insulating film.

An eleventh aspect of the invention is an electrostatic chuck according to the first aspect of the invention, wherein ratio of length to outer diameter of the ceramic porous body is 0.6 or more.

In this electrostatic chuck, the ratio of length to outer diameter of the insulator plug including the ceramic porous body and the ceramic insulating film is set to 0.6 or more. This can achieve high insulation performance.

A twelfth aspect of the invention is an electrostatic chuck according to the eleventh aspect of the invention, wherein the outer diameter of the ceramic porous body is 1 millimeter or more.

In this electrostatic chuck, the cold spot of the clamped target can be set to 1° C. or less.

A thirteenth aspect of the invention is an electrostatic chuck according to the eleventh aspect of the invention, wherein the length of the ceramic porous body is 3 millimeter or more.

In this electrostatic chuck, the length of the ceramic porous body is set to 3 millimeter or more. This can achieve high insulation performance.

A fourteenth aspect of the invention is an electrostatic chuck according to the first aspect of the invention, wherein L/D is 5 or more, where D is inner diameter of the through hole, and L is distance from center of the through hole to outer periphery of the ceramic porous body.

In this electrostatic chuck, L/D is set to 5 or more. This can enhance the insulation breakdown voltage in the through hole and the gas feed channel.

A fifteenth aspect of the invention is an electrostatic chuck according to the first aspect of the invention, wherein flow rate of He gas flowing out per the through hole is 0.5 sccm or more and 14 sccm or less when pressure difference of the He gas is 30 Torr.

In this electrostatic chuck, a ceramic porous body is provided in the gas feed channel. A through hole for releasing the gas is provided on the ceramic porous body. In this electrostatic chuck, what is called hot spots and cold spots are less likely to occur in the clamped target directly above the through hole.

A sixteenth aspect of the invention is an electrostatic chuck according to the first aspect of the invention, wherein flow rate of He gas flowing out per the ceramic porous body is 3 sccm or more and 24 sccm or less when pressure difference of the He gas is 30 Torr.

In this electrostatic chuck, a ceramic porous body is provided in the gas feed channel. A through hole for releasing the gas is provided on the ceramic porous body. In this electrostatic chuck, what is called hot spots and cold spots are less likely to occur in the clamped target directly above the through hole.

A seventeenth aspect of the invention is an electrostatic chuck according to the first aspect of the invention, wherein inner diameter of the through hole is 0.05 millimeters or more and 1 millimeter or less.

In this electrostatic chuck, a ceramic porous body is provided in the gas feed channel. A through hole for releasing the gas is provided on the ceramic porous body. In this electrostatic chuck, what is called hot spots and cold spots are less likely to occur in the clamped target directly above the through hole.

An eighteenth aspect of the invention is an electrostatic chuck according to the first aspect of the invention, wherein outer diameter of the ceramic porous body is 7 millimeters or less.

In this electrostatic chuck, a ceramic porous body is provided in the gas feed channel. A through hole for releasing the gas is provided on the ceramic porous body. In this electrostatic chuck, what is called hot spots and cold spots are less likely to occur in the clamped target directly above the through hole.

Embodiments of the invention will now be described with reference to the drawings. In the drawings, similar components are labeled with like reference numerals, and the detailed description thereof is omitted appropriately.

FIG. 1 is a schematic sectional view illustrating a configuration of an electrostatic chuck according to this embodiment.

Figure 2:
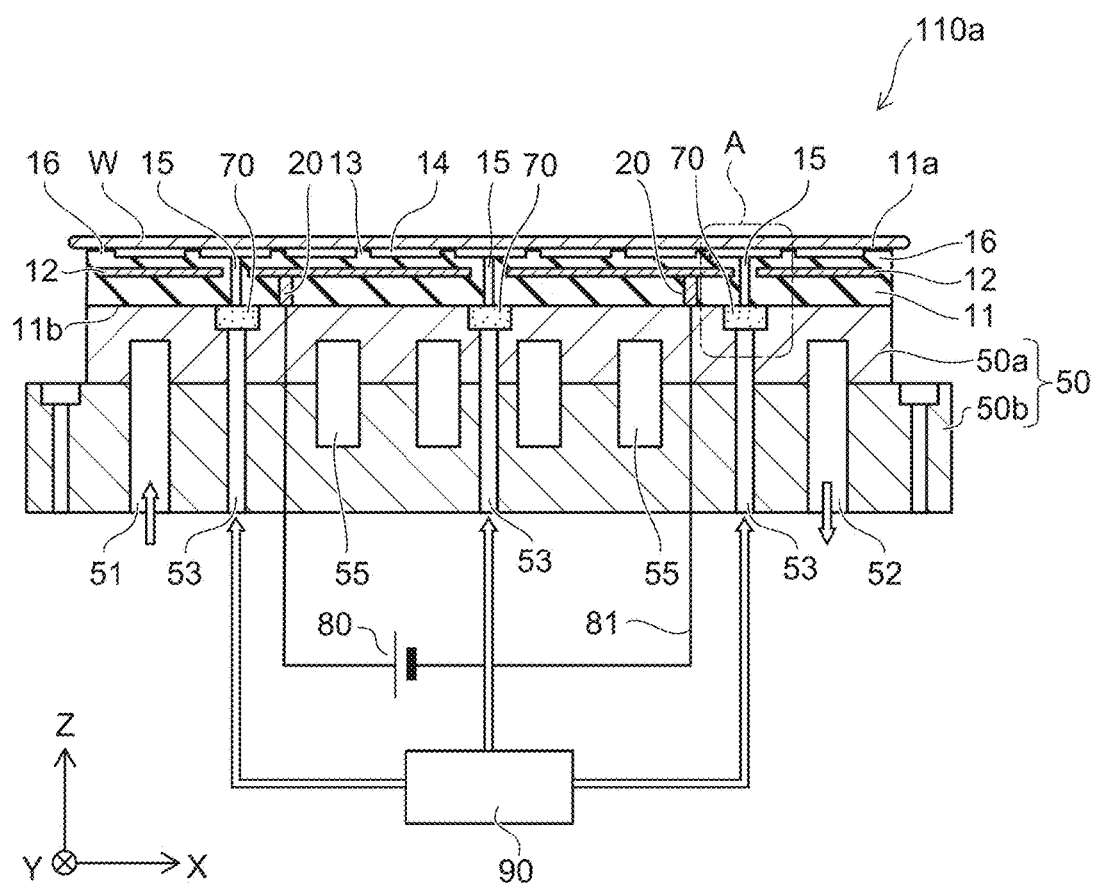
FIG. 2 is a schematic sectional view illustrating an alternative configuration of the electrostatic chuck according to this embodiment.

FIG. 2 is a schematic sectional view illustrating an alternative configuration of the electrostatic chuck according to this embodiment.

Figure 3:
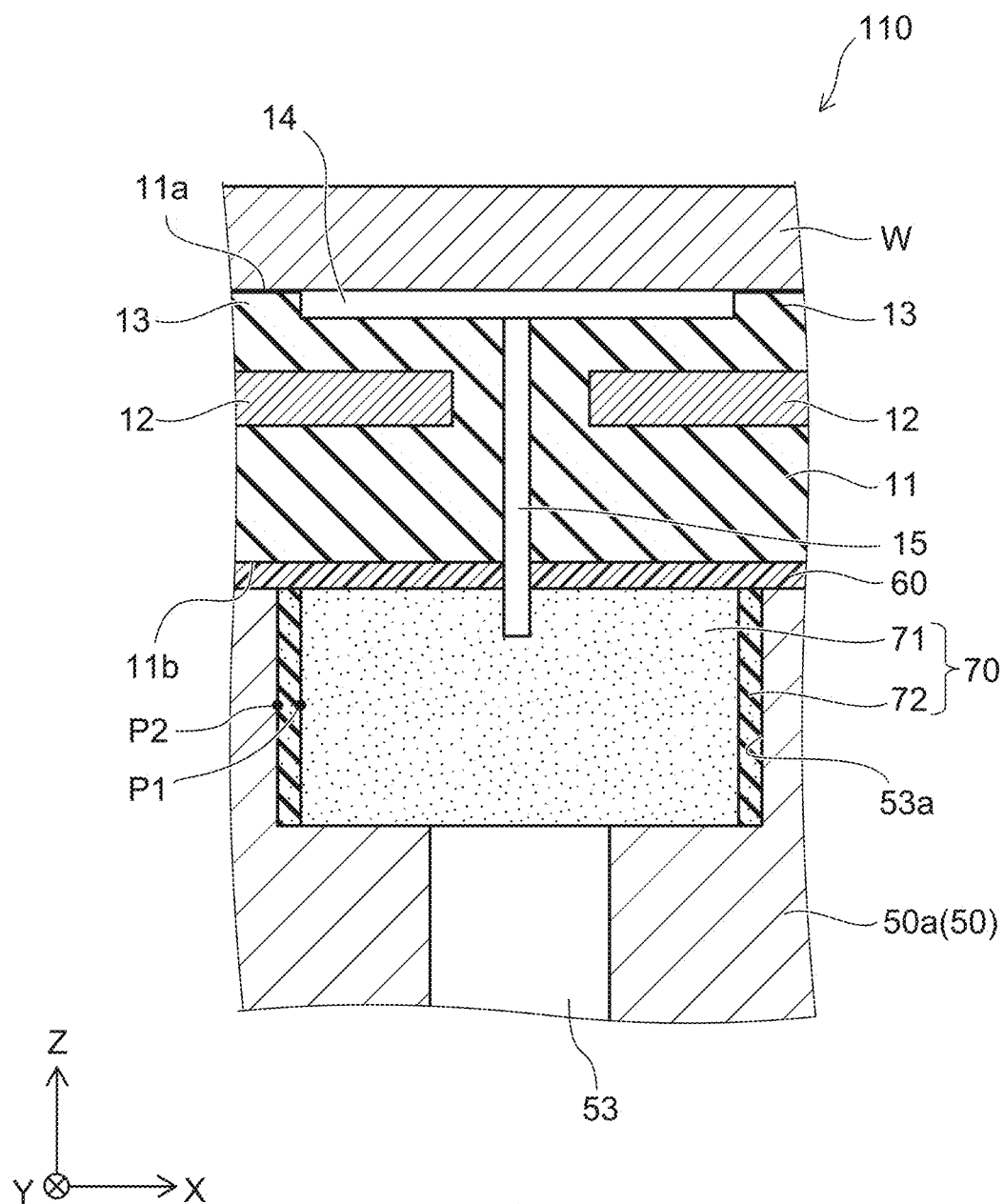
FIG. 3 is a schematic enlarged sectional view of part A shown in FIGS. 1 and 2.

FIG. 3 is a schematic enlarged sectional view of part A shown in FIGS. 1 and 2.

Figures 4, 5:
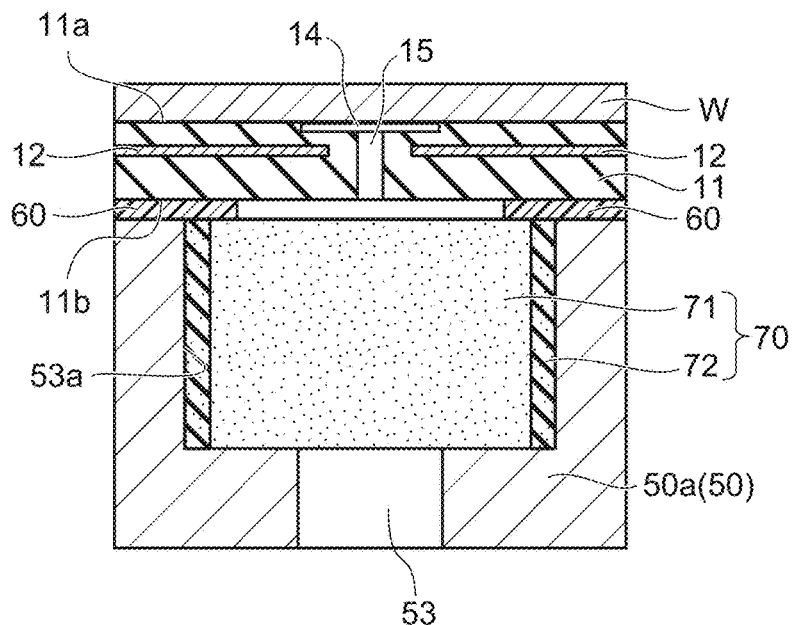
FIG. 4 is a schematic enlarged sectional view showing a variation of the part A shown in FIGS. 1 and 2.
FIG. 5 shows an example of the ceramic insulating film.

FIG. 4 is a schematic enlarged sectional view showing a variation of the part A shown in FIGS. 1 and 2.

As shown in FIG. 1, the electrostatic chuck 110 according to this embodiment includes a ceramic dielectric substrate 11, a base plate 50, and an insulator plug 70.

The ceramic dielectric substrate 11 is e.g. a flat plate-like base material made of sintered ceramic. The ceramic dielectric substrate 11 has a first major surface 11a and a second major surface 11b on the side opposite from the first major surface 11a. A clamped target W such as a semiconductor substrate like a silicon wafer is mounted on the first major surface 11a.

The ceramic dielectric substrate 11 is provided with an electrode 12. The electrode 12 is interposed between the first major surface 11a and the second major surface 11b of the ceramic dielectric substrate 11. That is, the electrode 12 is formed so as to be inserted in the ceramic dielectric substrate 11. By application of a clamping voltage 80 to this electrode 12, the electrostatic chuck 110 generates charge on the first major surface 11a side of the electrode 12 and clamps the target W by electrostatic force.

Here, in the description of this embodiment, the direction (first direction) connecting the first major surface 11a and the second major surface 11b is referred to as Z-direction. One of the directions (second direction) orthogonal to the Z-direction is referred to as Y-direction. The direction (third direction) orthogonal to the Z-direction and the Y-direction is referred to as X-direction.

The electrode 12 is provided like a thin film along the first major surface 11a and the second major surface 11b of the ceramic dielectric substrate 11. The electrode 12 is a clamping electrode for clamping the target W. The electrode 12 may be of the unipolar type or the bipolar type. The electrode 12 shown in FIG. 1 is of the bipolar type, with electrodes 12 of two polarities provided on the same plane.

The electrode 12 is provided with a connection part 20 extending to the second major surface 11b side of the ceramic dielectric substrate 11. The connection part 20 is a via (solid type) or via hole (hollow type) in electrical continuity with the electrode 12, or a metal terminal connected by a suitable method such as brazing.

The base plate 50 is a member for supporting the ceramic dielectric substrate 11. The ceramic dielectric substrate 11 is fixed on the base plate 50 with a bonding member 60 shown in FIG. 3. The bonding member 60 is e.g. a silicone adhesive.

The base plate 50 is e.g. divided into an upper part 50a and a lower part 50b made of aluminum. A communication channel 55 is provided between the upper part 50a and the lower part 50b. One end side of the communication channel 55 is connected to an input channel 51, and the other end side is connected to an output channel 52. The base plate 50 has a hollow socket formed therein in communication with the gas feed channel 55.

The base plate 50 also serves to adjust the temperature of the electrostatic chuck 110. For instance, in the case of cooling the electrostatic chuck 110, a cooling medium is caused to flow in from the input channel 51, to pass through the communication channel 55, and to flow out from the output channel 52. This can absorb heat from the base plate 50 by the cooling medium to cool the electrostatic chuck 110 attached onto the base plate 50. On the other hand, in the case of keeping warm the electrostatic chuck 110, a heat-retaining medium can be put into the communication channel 55. Alternatively, a heating element can be incorporated in the electrostatic chuck 110 or the base plate 50. Thus, the temperature of the electrostatic chuck 110 is adjusted via the base plate 50. This can adjust the temperature of the target W clamped by the electrostatic chuck 110.

Furthermore, dots 13 are provided as necessary on the first major surface 11a side of the ceramic dielectric substrate 11. Grooves 14 are provided between the dots 13. The grooves 14 communicate with each other, and a space is formed between the back surface of the target W mounted on the electrostatic chuck 110 and the groove 14.

The groove 14 is connected with a through hole 15 provided in the ceramic dielectric substrate 11. The through hole 15 is provided through the ceramic dielectric substrate 11 from the second major surface 11b to the first major surface 11a of the ceramic dielectric substrate 11.

The height of the dots 13 (the depth of the grooves 14), the area ratio between the dots 13 and the grooves 14, the shapes thereof and the like can be appropriately selected to control the temperature of the target W and particles attached to the target W in a desirable state.

On the other hand, the base plate 50 is provided with a gas feed channel 53. For instance, the gas feed channel 53 is provided so as to penetrate through the base plate 50. The gas feed channel 53 may not penetrate through the base plate 50, but may branch halfway from another gas feed channel 53 and extend to the ceramic dielectric substrate 11 side. The gas feed channel 53 may be provided at a plurality of sites in the base plate 50.

The gas feed channel 53 communicates with the through hole 15. A transfer gas such as helium (He) is fed from the gas feed channel 53 while clamping the target W. Then, the transfer gas flows in the space provided between the target W and the groove 14 so that the target W can be directly cooled by the transfer gas.

As shown in FIG. 2, for instance, the supply amount of the transfer gas is controlled by a control section 90. The electrostatic chuck 110a shown in FIG. 2 is different from the electrostatic chuck 110 shown in FIG. 1 in further including a control section 90. The control section 90 controls the pressure difference of the transfer gas and the flow rate of the transfer gas.

The insulator plug 70 is provided in the gas feed channel 53 provided in the base plate 50. The insulator plug 70 is fitted in the ceramic dielectric substrate 11 side of the gas feed channel 53. As shown in FIG. 2, for instance, a counterbore part 53a is provided on the ceramic dielectric substrate 11 side of the gas feed channel 53. The counterbore part 53a is provided in a tubular shape. The inner diameter of the counterbore part 53a is suitably designed so that the insulator plug 70 is fitted in the counterbore part 53a.

The insulator plug 70 includes a ceramic porous body 71 and a ceramic insulating film 72. The ceramic porous body 71 is provided in a tubular (e.g., cylindrical) shape and fitted in the counterbore part 53a. The shape of the insulator plug 70 is preferably a cylindrical shape, but is not limited to a cylindrical shape. The ceramic porous body 71 is made of a material having insulation property. The material of the ceramic porous body 71 may be e.g. $Al_2O_3$, $Y_2O_3$, $ZrO_2$, MgO, SiC, AlN, $Si_3N_4$, or a glass such as $SiO_2$. Alternatively, the material of the ceramic porous body 71 may be e.g. $Al_2O_3$—$TiO_2$, $Al_2O_3$—MgO, $Al_2O_3$—$SiO_2$, $Al_6O_{13}Si_2$, YAG, or $ZrSiO_4$.

The porosity of the ceramic porous body 71 is e.g. 30 percent (%) or more and 60% or less. The density of the ceramic porous body 71 is e.g. 1.5 grams per cubic centimeter ($g/cm^3$) or more and 3.0 $g/cm^3$ or less. With such porosity, the transfer gas such as He carried in the gas feed channel 53 passes through numerous pores of the ceramic porous body 71. Thus, the transfer gas is fed from the through hole 15 provided in the ceramic dielectric substrate 11 to the groove 14.

The ceramic insulating film 72 is provided between the ceramic porous body 71 and the gas feed channel 53. The ceramic insulating film 72 is denser than the ceramic porous body 71. As described later with reference to FIG. 5, the ceramic insulating film 72 is formed by e.g. thermal spraying. The porosity of the ceramic insulating film 72 is e.g.

10% or less. The density of the ceramic insulating film 72 is e.g. 3.0 g/cm³ or more and 4.0 g/cm³ or less. The ceramic insulating film 72 is provided on the side surface of the ceramic porous body 71. The ceramic insulating film 72 is a ceramic sprayed film made of e.g. $Al_2O_3$ or $Y_2O_3$.

The porosity of the ceramic dielectric substrate 11 is e.g. 1% or less. The density of the ceramic dielectric substrate 11 is e.g. 4.2 g/cm³.

The porosity is measured by a laser microscope based on JIS C 2141. The density is measured based on JIS C 2141 5.4.3.

As shown in FIG. 3, the insulator plug 70 is fitted in the counterbore part 53a of the gas feed channel 53. Then, the ceramic insulating film 72 is in contact with the base plate 50. That is, the ceramic porous body 71 and the ceramic insulating film 72 having high insulation performance are interposed between the through hole 15 for guiding the transfer gas such as He to the groove 14 and the metallic base plate 50. Use of such an insulator plug 70 can achieve higher insulation performance than in the case where only the ceramic porous body 71 is provided in the gas feed channel 53.

As shown in FIG. 4, the through hole 15 may not be provided in the upper part of the ceramic porous body 71. In this case, the region of the bonding member 60 provided on the ceramic porous body 71 is preferably made smaller than the example shown in FIG. 3. This can suppress that the bonding member 60 acts as a particle source due to damage by plasma irradiation through the through hole 15 provided above the ceramic porous body 71. The insulator plug 70 may be fitted in the counterbore part 53a provided on the ceramic dielectric substrate 11 side.

FIG. 5 shows an example of the ceramic insulating film.

As shown in FIG. 5, the material of the ceramic insulating film 72 is e.g. $Al_2O_3$, $Y_2O_3$, $ZrO_2$, or MgO. Alternatively, the material of the ceramic insulating film 72 may be e.g. $Al_2O_3$—$TiO_2$, $Al_2O_3$—MgO, $Al_2O_3$—$SiO_2$, $Al_6O_{13}Si_2$, YAG, or $ZrSiO_4$.

The ceramic insulating film 72 is formed by thermal spraying on the side surface of the ceramic porous body 71. Thermal spraying refers to a method for forming a coating as follows. A coating material is melted or softened by heating, and turned into fine particles. The fine particles are accelerated and bombarded on the side surface of the ceramic porous body 71. Thus, the flattened particles are solidified or deposited into a coating. Alternatively, the ceramic insulating film 72 may be fabricated by e.g. PVD (physical vapor deposition), CVD, sol-gel technique, or aerosol deposition technique.

In the case where the ceramic insulating film 72 is formed by thermal spraying of ceramic, the film thickness is e.g. 0.05 mm or more and 0.5 mm or less. In this case, the insulation breakdown voltage is e.g. 5.3 kV/mm or more and 7.7 kV/mm or less. In the case where the film thickness of the ceramic insulating film 72 is less than 0.05 mm, variation in the film thickness of the ceramic insulating film 72 may locally produce a site having a thin film thickness. This may decrease the breakdown voltage. Thus, the film thickness of the ceramic insulating film 72 is preferably 0.05 mm or more. On the other hand, in the case where the film thickness of the ceramic insulating film 72 is thicker than 0.5 mm, a crack may occur in the ceramic insulating film 72 in manufacturing. This increases a heat insulation layer and may produce what is called a hot spot in the target W. Thus, the film thickness of the ceramic insulating film 72 is preferably 0.5 mm or less.

As a reference example, a space of 10 mm or less may be provided between the ceramic porous body 71 and the base plate 50. In this case, the insulation breakdown voltage is e.g. 1 kV/mm.

Figure 6A:
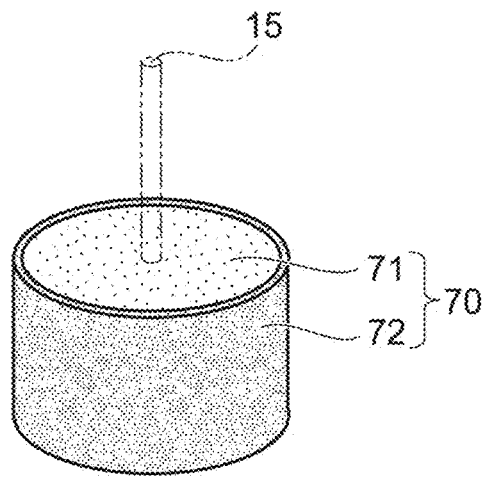
FIGS. 6A and 6B are schematic perspective views illustrating the relationship between the insulator plug and the through hole.
Figure 6B:
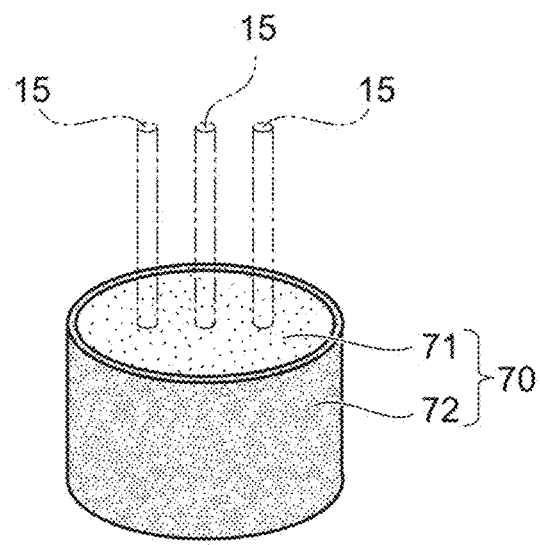

FIGS. 6A and 6B are schematic perspective views illustrating the relationship between the insulator plug and the through hole.

FIGS. 6A and 6B illustrate the positional relationship between the insulator plug 70 and the through hole 15. The through hole 15 is shown by a double-dot dashed line. In the example shown in FIG. 6A, one through hole 15 is placed on one insulator plug 70. The through hole 15 is placed on e.g. the vicinity of the center of the insulator plug 70.

In the example shown in FIG. 6B, a plurality of through holes 15 are placed on one insulator plug 70. FIG. 6B shows an example in which three through holes 15 are placed. In the case where a plurality of through holes 15 are placed on one insulator plug 70, insulation breakdown is likely to occur in one of the plurality of through holes 15 nearest to the outer periphery of the ceramic porous body 71.

In some cases, this embodiment is described with reference to the example in which one through hole 15 is placed on one insulator plug 70 as shown in FIG. 6A.

Figure 7A:
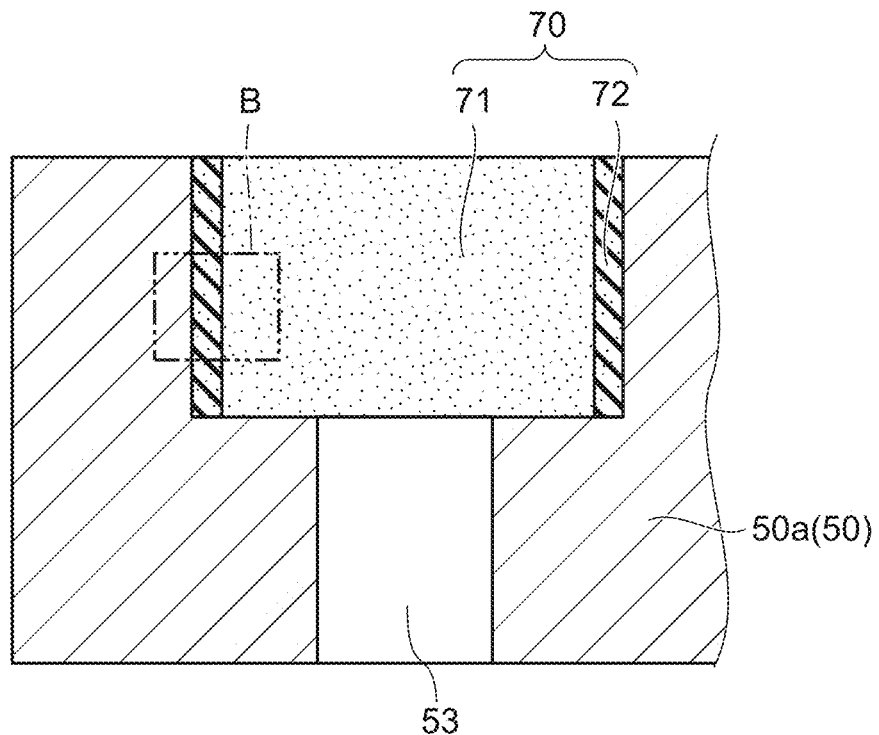
FIGS. 7A and 7B are schematic views showing a neighborhood of the insulator plug of this embodiment.
Figure 7B:
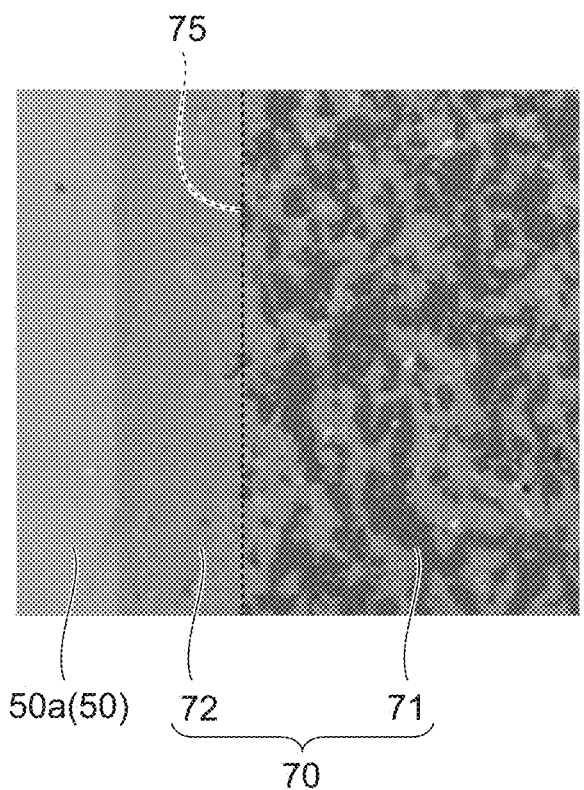

FIGS. 7A and 7B are schematic views showing a neighborhood of the insulator plug of this embodiment.

FIG. 7A is a schematic sectional view showing the insulator plug of this embodiment. FIG. 7B is a photograph enlarging the region B shown in FIG. 7A.

As shown in FIG. 7B, in the insulator plug 70 of this embodiment, the ceramic insulating film 72 bites into the ceramic porous body 71 from its surface. The term "bite into" refers to the following state. The boundary part between the ceramic insulating film 72 and the ceramic porous body 71 is not laminar, but has asperities at its surface. In cross section, it is observed that the ceramic insulating film 72 extends into the ceramic porous body 71 by a certain length from the outermost periphery. The boundary part between the ceramic insulating film 72 and the ceramic porous body 71 is corrugated in the actual three-dimensional shape. More specifically, the ceramic insulating film 72 exists in the portion of 100 μm or less from the surface toward the inside of the ceramic porous body 71. More desirably, the ceramic insulating film 72 exists in the portion of 50 μm or less from the surface toward the inside of the ceramic porous body 71.

In this specification, the "surface of the ceramic porous body" or the "boundary part between the ceramic porous body and the ceramic insulating film" refers to the boundary line 75 (see FIG. 7B) in the cross section of the insulator plug observed by a scanning electron microscope (SEM). Here, the boundary line 75 connects a plurality of points (e.g., two points) selected from the points located in the boundary part of 5 μm or less existing at the interface between different compositions, or the outermost side (ceramic insulating film side) of the ceramic porous body.

The amount of the ceramic insulating film 72 biting into the ceramic porous body 71 from its surface can be measured in a cross-sectional photograph observed by SEM. The material of the ceramic insulating film 72 may be elongated in SEM observation. In this case, the cross section can be observed using e.g. CP (Cross Section Polisher (registered trademark)) polishing.

Resin and glass conduct heat less easily than ceramic. Thus, use of e.g. resin or glass for the insulating film may produce what is called a hot spot in the target W on the through hole 15. On the other hand, the insulating film may be formed from resin or rubber by a sleeve. Then, a heat insulating layer (air layer) is formed in the boundary part between the ceramic porous body 71 and the insulating film. This may produce what is called a hot spot in the target W on the through hole 15.

In contrast, the insulator plug 70 of this embodiment has a structure in which the ceramic insulating film 72 bites into the ceramic porous body 71 from its surface. The ceramic insulating film 72 includes air (buffer layer), while being in contact with the ceramic porous body 71 and the base plate 50. The contact mode of the ceramic insulating film 72 and the ceramic porous body 71 is e.g. point contact in the form of a biting contact part. The contact mode of the ceramic insulating film 72 and the base plate 50 is e.g. point contact. Thus, no laminar heat insulating layer (air layer) exists at the boundary between the ceramic porous body 71 and the ceramic insulating film 72. Accordingly, the temperature distribution of the target W is made uniform. This can suppress the occurrence of what is called hot spots in the target W on the through hole 15.

The insulating film may be formed from rubber such as a heat-shrinkable tube. Then, compared with the case of forming the ceramic insulating film 72 by thermal spraying of ceramic, the rubber does not bite into the ceramic porous body 71 but exists only on the surface of the ceramic porous body 71. Thus, the insulating film may peel from the ceramic porous body 71. Peeling of the insulating film from the ceramic porous body 71 may decrease the insulation breakdown voltage. Furthermore, a laminar heat insulating layer is included. This fails to suppress the occurrence of what is called hot spots in the target W on the through hole 15.

In contrast, the insulator plug 70 of this embodiment has a structure in which the ceramic insulating film 72 bites into the ceramic porous body 71 from its surface. Thus, due to the anchor effect, the ceramic insulating film 72 is less prone to peeling from the ceramic porous body 71. This can enhance the insulation breakdown voltage.

The insulating film may be formed by e.g. bonding a ceramic. Then, compared with the case of forming the ceramic insulating film 72 by thermal spraying of ceramic, the adhesive extends into the ceramic porous body 71 more deeply. Thus, the adhesive seals the ceramic porous body 71 and the void inside the porous body. This may decrease the flow rate of the transfer gas.

In contrast, the insulator plug 70 of this embodiment has a structure in which the ceramic insulating film 72 bites into the ceramic porous body 71 from its surface. This can suppress that the side surface or inside of the ceramic porous body 71 is sealed with e.g. an adhesive when the insulator plug 70 is placed in the gas feed channel 53. Thus, the decrease of the flow rate of the transfer gas flowing from the gas feed channel 53 to the through hole 15 can be suppressed.

In this embodiment, the thermal expansion coefficient of the ceramic insulating film 72 is generally equal to the thermal expansion coefficient of the ceramic porous body 71. The thermal expansion coefficient of the ceramic insulating film 72 is generally equal to the thermal expansion coefficient of the ceramic dielectric substrate 11. The thermal expansion coefficient of each of the ceramic insulating film 72, the ceramic porous body 71, and the ceramic dielectric substrate 11 is e.g. $7.0 \times 10^{-6}$/° C. or more and $10.0 \times 10^{-6}$/° C. or less in the environment of 25° C. or more and 800° C. or less. The thermal expansion coefficient is calculated by measuring the elongation by combining the ceramic insulating film 72 with a material whose thermal expansion coefficient is already known. Alternatively, the thermal expansion coefficient is calculated by SEM or a thermal dilatometer (TMA (thermal mechanical analysis).

The thermal expansion coefficient of the ceramic porous body 71 is generally equal to the thermal expansion coefficient of the ceramic insulating film 72. Thus, the ceramic porous body 71 and the ceramic insulating film 72 can follow each other in response to the temperature change. This can suppress the destruction of the ceramic porous body 71 and the ceramic insulating film 72. Thus, stable cooling performance can be maintained during the process.

The thermal conductivity of the ceramic porous body 71 is generally equal to the thermal conductivity of the ceramic insulating film 72. The thermal conductivity of each of the ceramic porous body 71 and the ceramic insulating film 72 is e.g. 0.3 watts per meter kelvin (W/m·K) or more and 10 W/m·K or less.

The outer diameter of the insulator plug 70 can be made smaller in the case of forming the ceramic insulating film 72 by thermal spraying than in the case of forming the insulating film by a sleeve. In the case of forming the insulating film by a sleeve, the thickness of the sleeve requires approximately 1 millimeter (mm). That is, in the case of forming the ceramic insulating film 72 by thermal spraying, the thickness of the ceramic insulating film 72 can be made thinner. Thus, hindrance to the flow of the transfer gas can be suppressed, and formation of a heat insulating layer of air can be suppressed. This can suppress the occurrence of what is called hot spots in the target W on the through hole 15.

FIGS. 8A to 8F are schematic sectional views illustrating variations of the insulator plug of this embodiment.

Figure 8A:
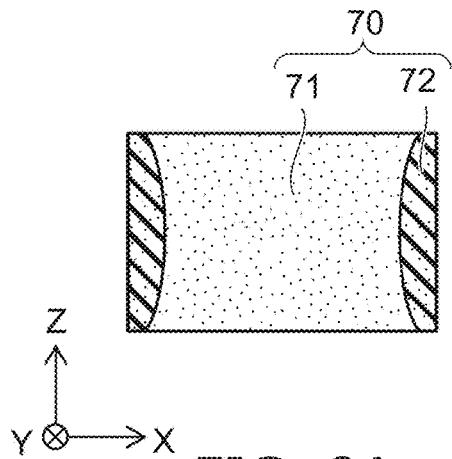
FIGS. 8A to 8F are schematic sectional views illustrating variations of the insulator plug of this embodiment.
Figure 8B:
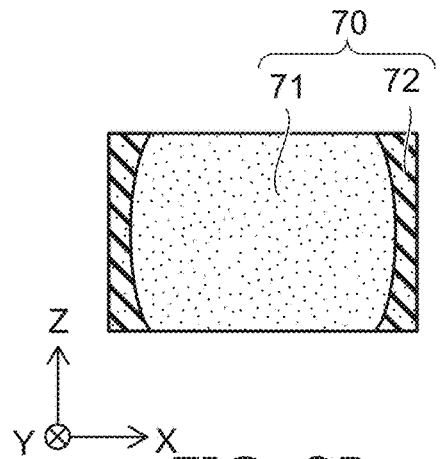

As shown in FIGS. 8A and 8B, the ceramic insulating film 72 may have a curved surface in a cross section of the insulator plug 70. In the example shown in FIG. 8A, the central part in the Z-direction of the ceramic insulating film 72 is curved toward the inside of the ceramic porous body 71. In the example shown in FIG. 8B, the central part in the Z-direction of the ceramic insulating film 72 is curved toward the outside of the ceramic porous body 71.

Figure 8C:
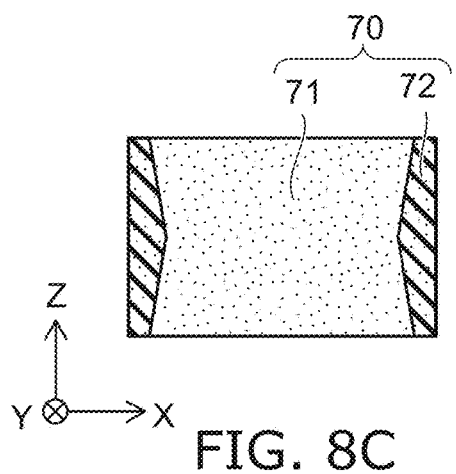
Figure 8D:
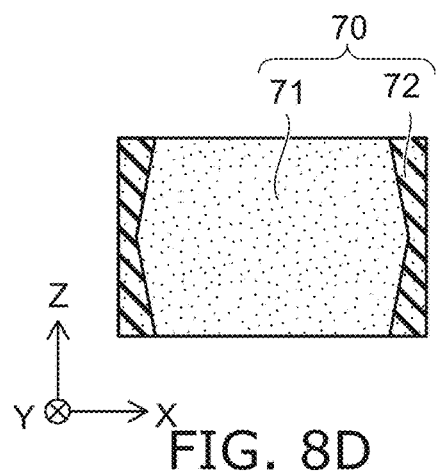

As shown in FIGS. 8C and 8D, the ceramic insulating film 72 may have a taper shape in a cross section of the insulator plug 70. In the example shown in FIG. 8C, the central part in the Z-direction of the ceramic insulating film 72 is inclined toward the inside of the ceramic porous body 71. In the example shown in FIG. 8D, the central part in the Z-direction of the ceramic insulating film 72 is inclined toward the outside of the ceramic porous body 71.

Figure 8E:
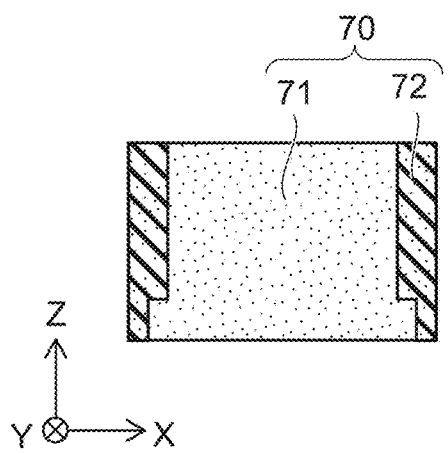
Figure 8F:
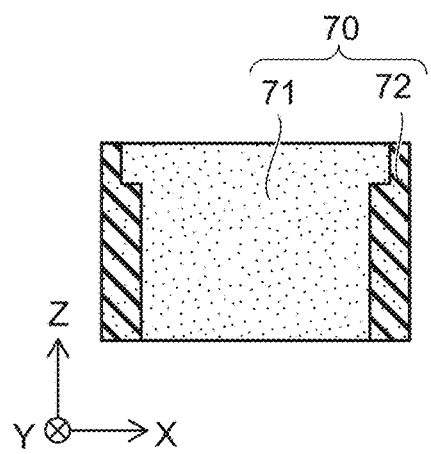

As shown in FIGS. 8E and 8F, the ceramic insulating film 72 may have a step shape in a cross section of the insulator plug 70. In the example shown in FIG. 8E, a step difference is provided in the lower part in the Z-direction of the ceramic insulating film 72. In the example shown in FIG. 8F, a step difference is provided in the upper part in the Z-direction of the ceramic insulating film 72.

Figure 9:
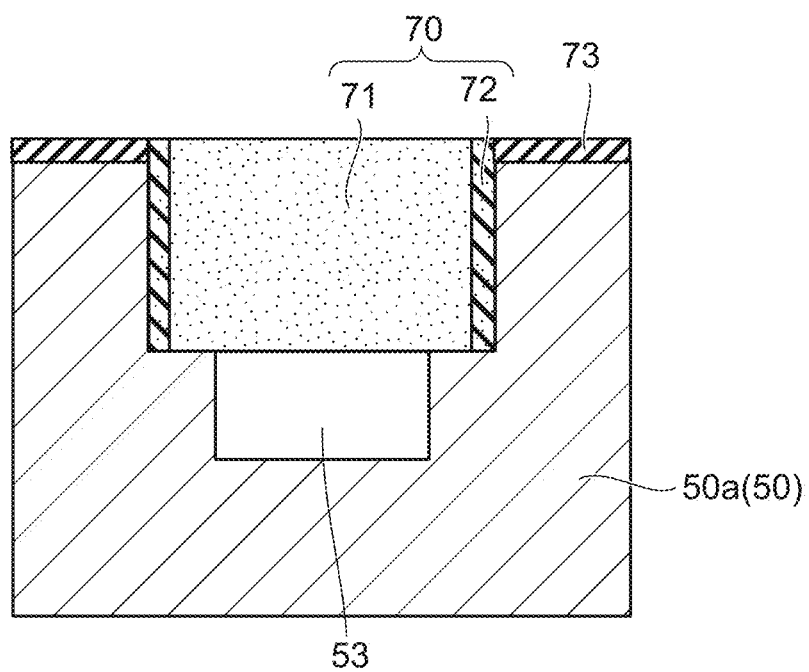
FIG. 9 is a schematic view showing an alternative example of the neighborhood of the insulator plug of this embodiment.

FIG. 9 is a schematic view showing an alternative example of the neighborhood of the insulator plug of this embodiment.

As shown in FIG. 9, the ceramic insulating film formed by e.g. thermal spraying may be provided on not only the side surface of the ceramic porous body 71 but also the surface of the upper part 50a of the base plate 50. In the case where the ceramic insulating film 73 is provided on the surface of the upper part 50a of the base plate 50, the adhesive strength between the base plate 50 and the ceramic dielectric substrate 11 can be increased. This is because the surface roughness of the ceramic insulating film 73 is larger than the surface roughness of the metallic base plate 50.

The ceramic insulating film 73 provided on the surface of the upper part 50a of the base plate 50 enhances the insulation breakdown voltage when a high frequency voltage is applied to the electrode 12. This can suppress the decrease of insulation breakdown voltage in the end part of the ceramic insulating film 72 provided on the side surface of the ceramic porous body 71.

Furthermore, the ceramic insulating film 73 provided on the surface of the upper part 50a of the base plate 50 relaxes the difference between the thermal expansion of the base plate 50 and the thermal expansion of the ceramic dielectric substrate 11. Thus, the ceramic insulating film 73 provided on the surface of the upper part 50a of the base plate 50 can relax the stress occurring by application of heat. The stress relaxation also holds in the ceramic insulating film 72 provided on the side surface of the ceramic porous body 71.

The stress relaxation is further described with reference to the drawings.

Figure 10A:
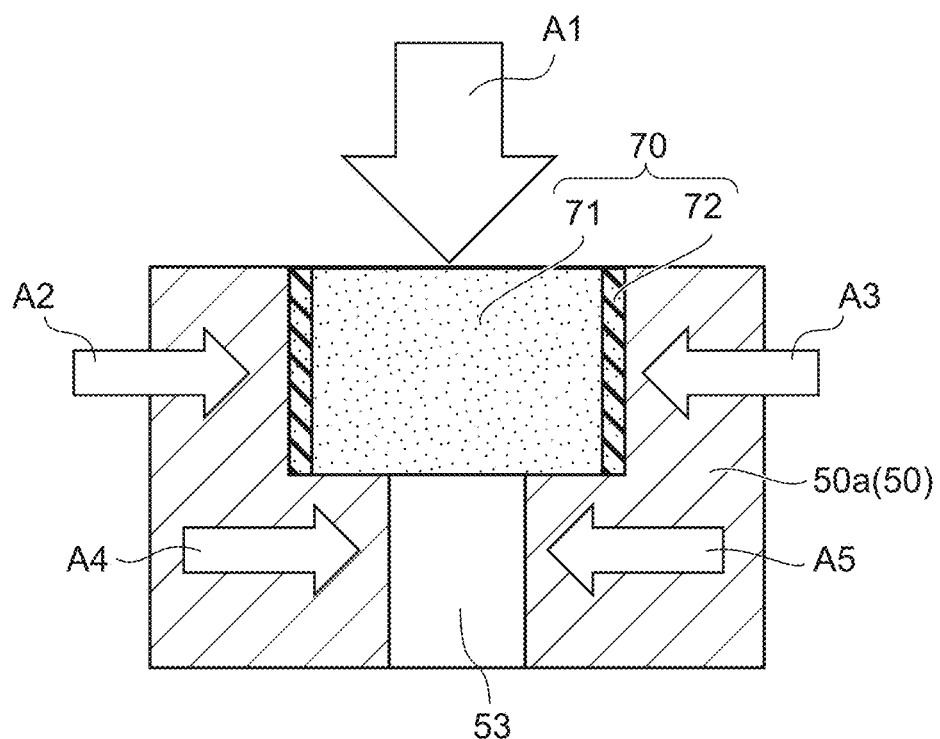
FIGS. 10A and 10B are schematic sectional views describing the stress relaxation of the ceramic insulating film of this embodiment.
Figure 10B:
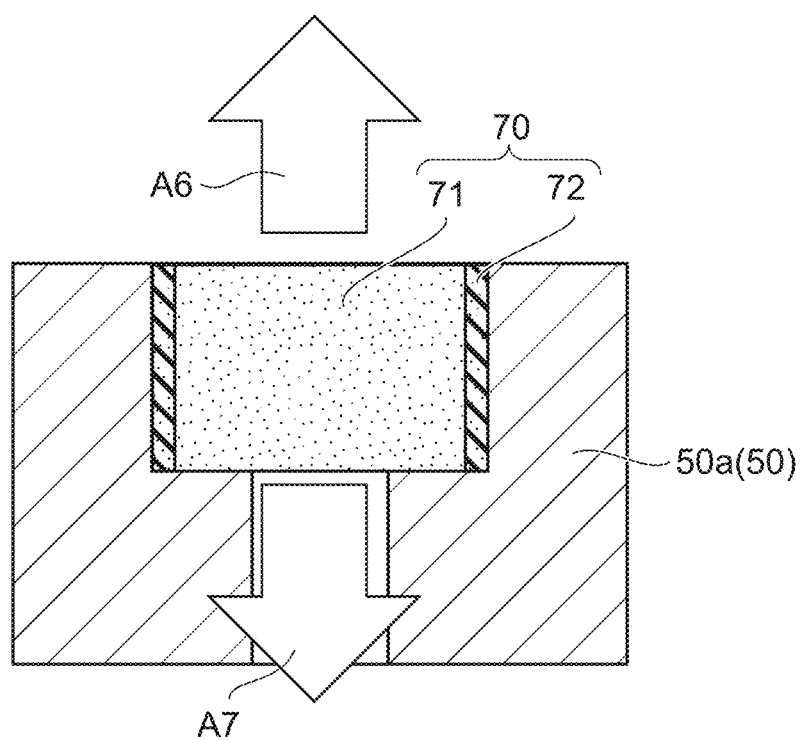

FIGS. 10A and 10B are schematic sectional views describing the stress relaxation of the ceramic insulating film of this embodiment.

FIG. 10A is a schematic sectional view illustrating an example of the stress occurring when heat is applied to the base plate. FIG. 10B is a schematic sectional view illustrating an example of the stress occurring by air pressure change during the process.

The plasma process has been implemented with e.g. higher power and temperature. Furthermore, acceleration in throughput has been desired. Here, as indicated by arrow A1 shown in FIG. 10A, heat is applied to the base plate 50 during the process. This elongates the base plate 50. The elongation rate of the insulator plug 70 is different from the elongation rate of the base plate 50. Thus, as indicated by arrows A2-A5 shown in FIG. 10A, a stress occurs toward the inside of the insulator plug 70 and the inside of the gas feed channel 53. Then, as indicated by e.g. arrow A2 and arrow A3 shown in FIG. 10A, in the insulator plug 70, a stress occurs toward the inside of the insulator plug 70.

During the process, for instance, the inside of the chamber is placed in the atmospheric state or in the vacuum state. Then, as indicated by arrow A6 and arrow A7 shown in FIG. 10B, a stress occurs in the Z-direction in the insulator plug 70.

In this respect, the insulator plug 70 of this embodiment includes a ceramic insulating film 72. The ceramic insulating film 72 is provided between the ceramic porous body 71 and the gas feed channel 53. The ceramic insulating film 72 is denser than the ceramic porous body 71. Thus, the ceramic insulating film 72 functions as a stress relaxation layer for relaxing an externally applied stress.

This can suppress the destruction of the ceramic porous body 71 by an externally applied stress. Furthermore, this can suppress the decrease of insulation breakdown voltage. Furthermore, this can suppress that the transfer gas flows to the base plate 50 and causes electrical discharge. Thus, the decrease of reliability can be suppressed compared with the case where the ceramic insulating film 72 is formed from e.g. resin or tape. The ceramic insulating film 72 is formed by thermal spraying. Thus, the thickness of the ceramic insulating film 72 can be controlled more easily.

Next, an example of the ceramic porous body 71 and the ceramic insulating film 72 is described with reference to the drawings.

Figure 11:
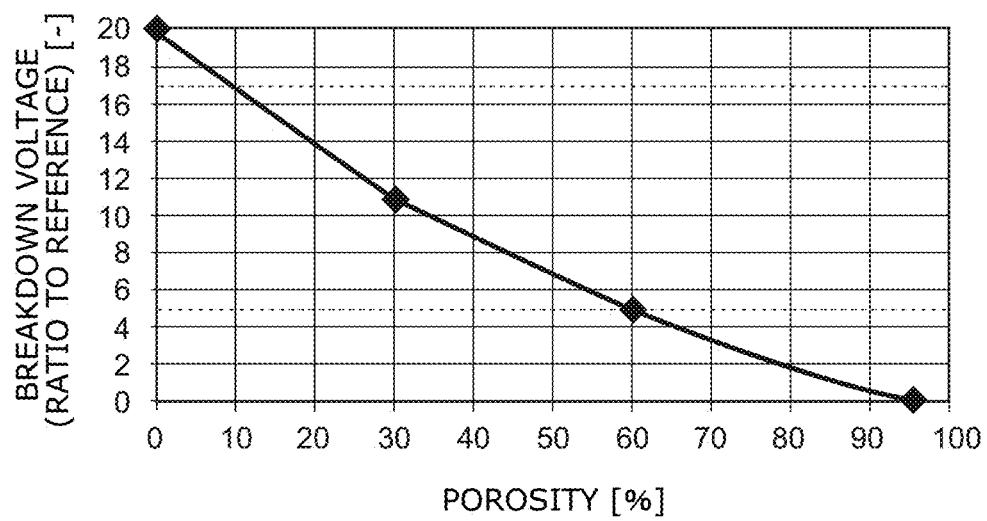
FIG. 11 is a graph illustrating the relationship between the porosity and the breakdown voltage.

FIG. 11 is a graph illustrating the relationship between the porosity and the breakdown voltage.

Figure 12:
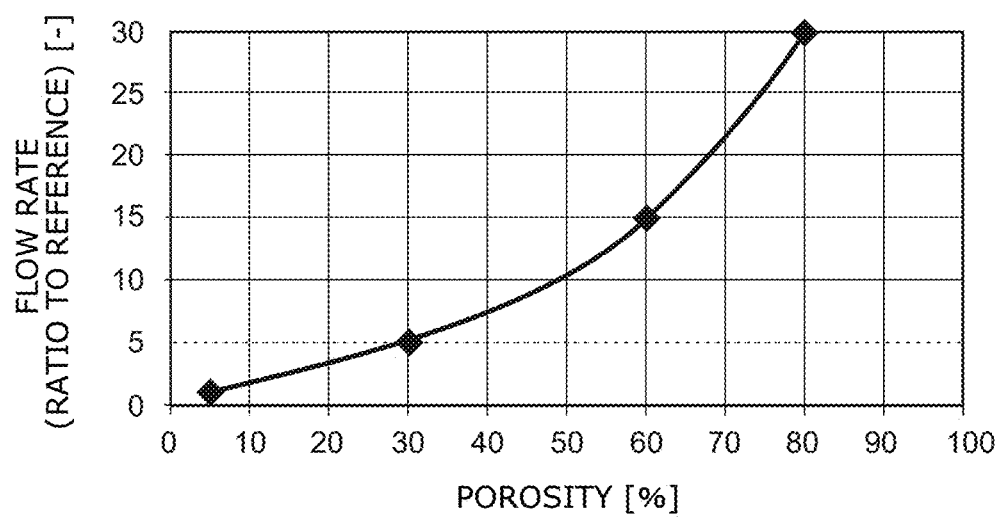
FIG. 12 is a graph illustrating the relationship between the porosity and the flow rate of the transfer gas.

FIG. 12 is a graph illustrating the relationship between the porosity and the flow rate of the transfer gas.

The horizontal axis of the graph shown in FIGS. 11 and 12 represents the porosity (%). The vertical axis of the graph shown in FIG. 11 represents the ratio of the breakdown voltage to the reference. The vertical axis of the graph shown in FIG. 12 represents the ratio of the flow rate of the transfer gas to the reference.

As shown in FIG. 11, when the porosity of the ceramic porous body 71 is higher than 60%, the ratio (safety factor) of the breakdown voltage to the reference is less than 5. When the breakdown voltage is less than or equal to the reference value, the insulation breakdown voltage is not improved. Thus, the porosity of the ceramic porous body 71 is preferably 60% or less.

As shown in FIG. 12, when the porosity of the ceramic porous body 71 is lower than 30%, the ratio of the flow rate of the transfer gas to the reference is less than 5. When the flow rate of the transfer gas is less than or equal to the reference value, the flow rate of the transfer gas decreases. This may produce what is called hot spots in the target W on the through hole 15. Thus, the porosity of the ceramic porous body 71 is preferably 30% or more.

Accordingly, the porosity of the ceramic porous body 71 is preferably 30% or more and 60% or less.

As shown in FIG. 11, when the porosity of the ceramic insulating film 72 is higher than 10%, the ratio (safety factor) of the breakdown voltage to the reference is less than 17. When the breakdown voltage is less than or equal to the reference value, the insulation breakdown voltage is not improved. Thus, the porosity of the ceramic insulating film 72 is preferably 10% or less.

Figure 13:
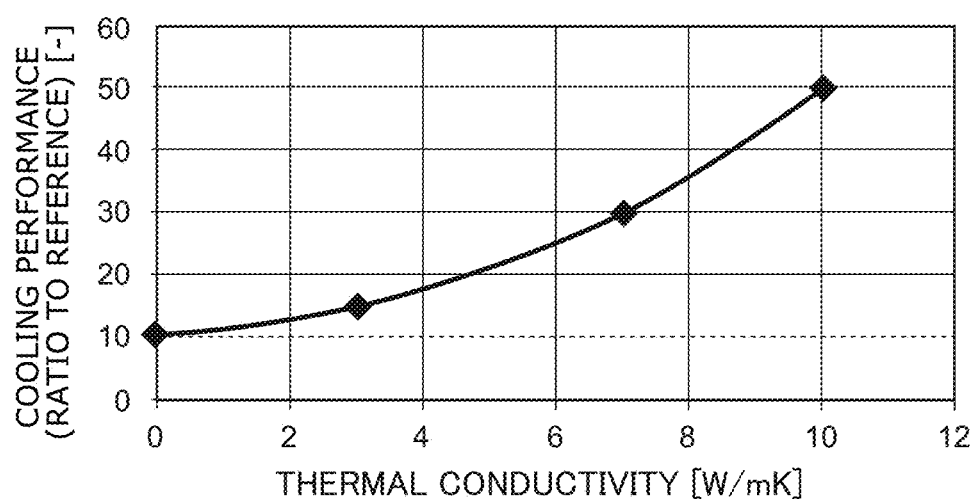
FIG. 13 is a graph illustrating the relationship between the thermal conductivity and the cooling performance.

FIG. 13 is a graph illustrating the relationship between the thermal conductivity and the cooling performance.

Figure 14A:
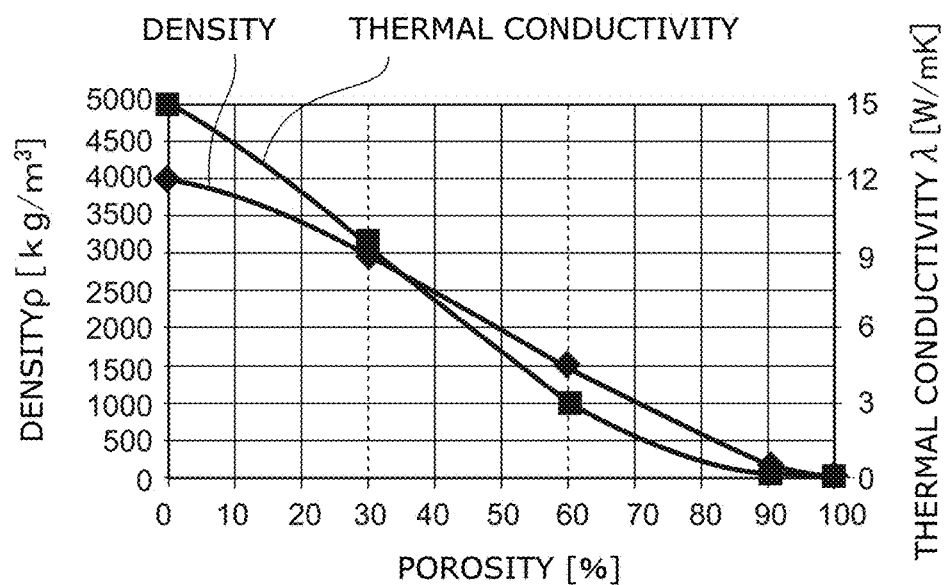
FIGS. 14A and 14B are graphs illustrating the relationship between the porosity and the thermal conductivity of the ceramic porous body, and the relationship between the porosity and the density of the ceramic porous body.
Figure 14B:
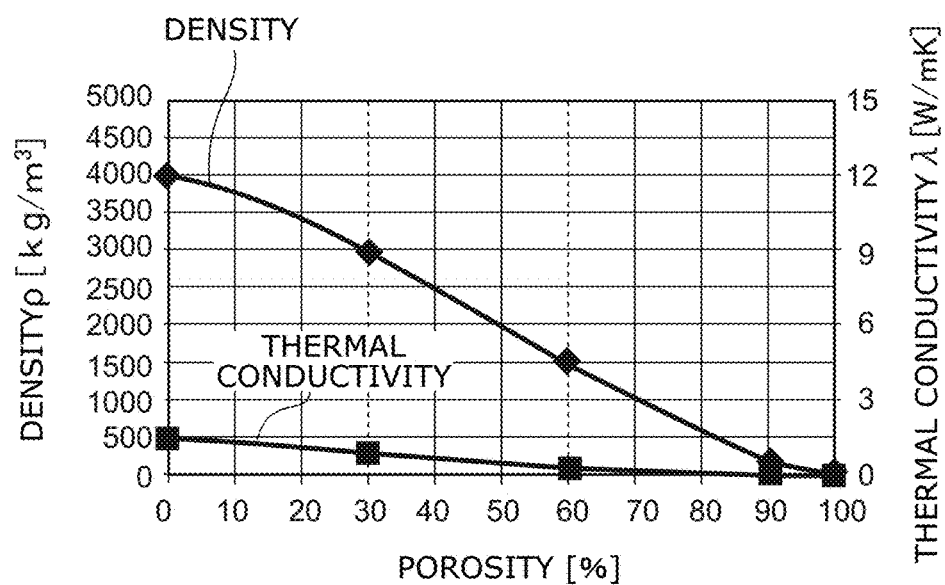

FIGS. 14A and 14B are graphs illustrating the relationship between the porosity and the thermal conductivity of the ceramic porous body, and the relationship between the porosity and the density of the ceramic porous body.

Figure 15:
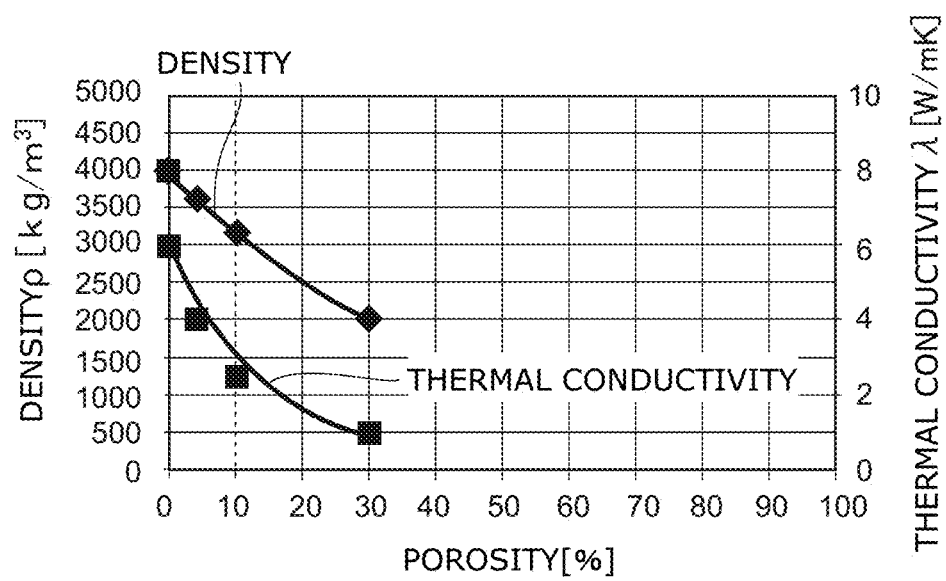
FIG. 15 is a graph illustrating the relationship between the porosity and the thermal conductivity of the ceramic insulating film, and the relationship between the porosity and the density of the ceramic insulating film.

FIG. 15 is a graph illustrating the relationship between the porosity and the thermal conductivity of the ceramic insulating film, and the relationship between the porosity and the density of the ceramic insulating film.

FIG. 14A is a graph illustrating the case where the material of the ceramic porous body 71 is $Al_2O_3$ (alumina). FIG. 14B is a graph illustrating the case where the material of the ceramic porous body 71 is $Y_2O_3$ (yttria).

The horizontal axis of the graph shown in FIG. 13 represents the thermal conductivity (W/m·K). The vertical axis of the graph shown in FIG. 13 represents the ratio of the cooling performance to the reference.

The horizontal axis of the graph shown in FIGS. 14A, 14B, and 15 represents the porosity (%). The vertical axis of the graph shown in FIGS. 14A and 14B represents the thermal conductivity of the ceramic porous body (right axis) and the density of the ceramic porous body (left axis). The vertical axis of the graph shown in FIG. 15 represents the thermal conductivity of the ceramic insulating film (right axis) and the density of the ceramic insulating film (left axis).

As shown in FIG. 13, when the thermal conductivity is lower than 0.3 W/m·K, the ratio of the cooling performance to the reference is less than 10. When the cooling performance is less than or equal to the reference value, what is called hot spots may occur in the target W on the insulator plug 70. Thus, the thermal conductivity of the ceramic porous body 71 is preferably 0.3 W/m·K or more. Furthermore, the thermal conductivity of the ceramic insulating film 72 is preferably 0.3 W/m·K or more.

As described above with reference to FIGS. 11 and 12, the porosity of the ceramic porous body 71 is preferably 30% or more and 60% or less. Thus, as shown in FIG. 14A, the thermal conductivity of the ceramic porous body 71 made of alumina is preferably 3 W/m·K or more and 10 W/m·K or less. The density of the ceramic porous body 71 made of alumina is preferably 1.5 g/cm³ or more and 3.0 g/cm³ or less. As shown in FIG. 14B, the thermal conductivity of the ceramic porous body 71 made of yttria is preferably 0.3 W/m·K or more and 1.0 W/m·K or less. The density of the ceramic porous body 71 made of yttria is preferably 4.5 g/cm³ or more and 9.0 g/cm³ or less. Thus, the thermal conductivity of the ceramic porous body 71 is preferably 0.3 W/m·K or more and 10 W/m·K or less. The density of the ceramic porous body 71 is preferably 1.5 g/cm³ or more and 3.0 g/cm³ or less.

As described above with reference to FIG. 11, the porosity of the ceramic insulating film 72 is preferably 10% or less. Thus, as shown in FIG. 15, the thermal conductivity of the ceramic insulating film 72 is preferably 3 W/m·K or more and 8 W/m·K or less. The density of the ceramic insulating film 72 is preferably 3 g/cm³ or more and 4 g/cm³ or less.

Figure 16:
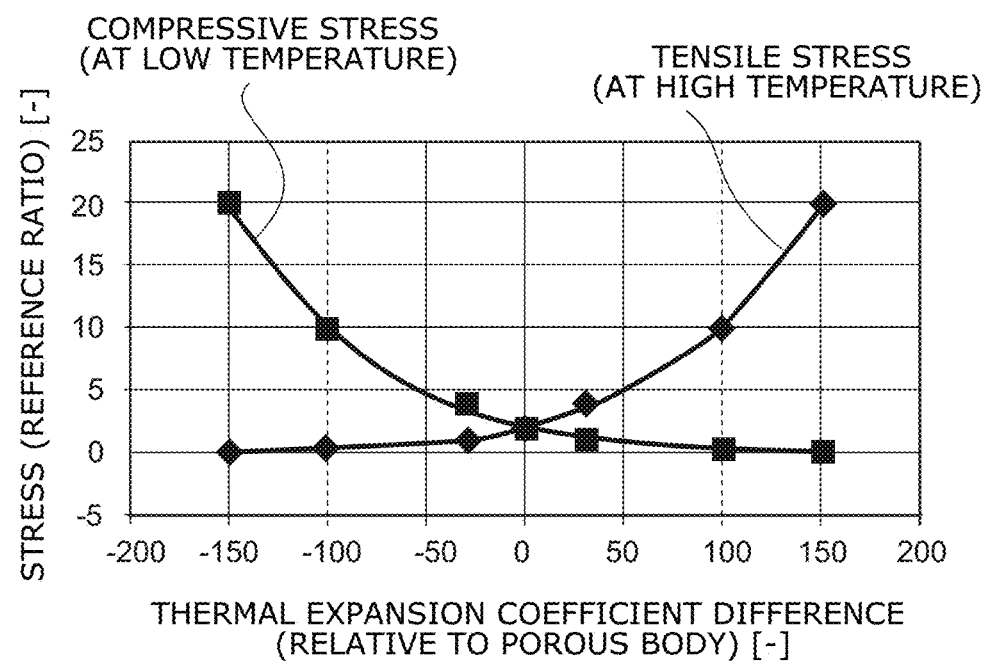
FIG. 16 is a graph illustrating the relationship between the ratio of the difference in thermal expansion coefficient and the stress.

FIG. 16 is a graph illustrating the relationship between the ratio of the difference in thermal expansion coefficient and the stress.

The horizontal axis of the graph shown in FIG. 16 represents the ratio of the difference between the thermal expansion coefficient of the ceramic porous body 71 and the thermal expansion coefficient of the ceramic insulating film 72 with reference to the thermal expansion coefficient of the ceramic porous body 71. The vertical axis of the graph shown in FIG. 16 represents the ratio of the stress to the reference.

As shown in FIG. 16, when the ratio of the difference between the thermal expansion coefficient of the ceramic porous body 71 and the thermal conductivity of the ceramic insulating film 72 with reference to the thermal expansion coefficient of the ceramic porous body 71 is higher than 100%, the ratio of the stress to the reference is higher than 10. When the stress is more than or equal to the reference value, the ceramic porous body 71 may be destroyed. Thus, the ratio of the difference between the thermal expansion coefficient of the ceramic porous body 71 and the thermal expansion coefficient of the ceramic insulating film 72 with reference to the thermal expansion coefficient of the ceramic porous body 71 is preferably 100% or less. More preferably, the ratio of the difference between the thermal expansion coefficient of the ceramic porous body 71 and the thermal expansion coefficient of the ceramic insulating film 72 is 50% or less.

Figures 17, 18:
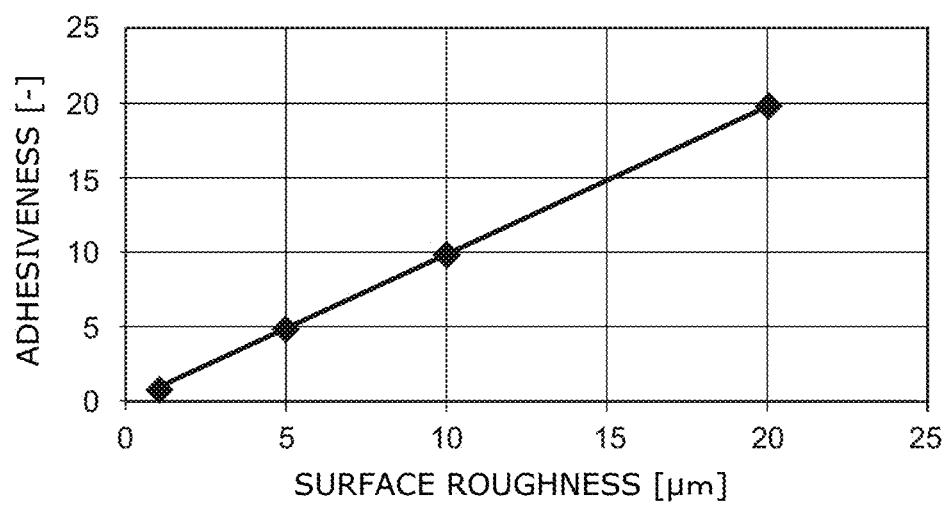
FIG. 17 is a table showing examples of the thermal expansion coefficient of the materials.
FIG. 18 is a graph illustrating the relationship between the surface roughness and the adhesiveness.

FIG. 17 is a table showing examples of the thermal expansion coefficient of the materials.

In the environment of 25° C. or more and 800° C. or less, the thermal expansion coefficient of $Al_2O_3$ (alumina) is e.g. $7.0 \times 10^{-6}/°$ C. The thermal expansion coefficient of $Y_2O_3$ is e.g. $7.2 \times 10^{-6}/°$ C. The thermal expansion coefficient of TiC—TiN is e.g. $7.4 \times 10^{-6}/°$ C. The thermal expansion coefficient of $Al_2O_3$ (sapphire) is e.g. $7.7 \times 10^{-6}/°$ C. The thermal expansion coefficient of MgO—$SiO_2$ is e.g. $7.7 \times 10^{-6}/°$ C. The thermal expansion coefficient of 2MgO—$SiO_2$ is e.g. $10.0 \times 10^{-6}/°$ C.

The material of the ceramic porous body 71 is as described above with reference to FIGS. 1 to 4. The thermal expansion coefficient of the ceramic porous body 71 is preferably $7.0 \times 10^{-6}/°$ C. or more and $10.0 \times 10^{-6}/°$ C. or less.

The material of the ceramic insulating film 72 is as described above with reference to FIG. 5. The thermal expansion coefficient of the ceramic insulating film 72 is preferably $7.0 \times 10^{-6}/°$ C. or more and $10.0 \times 10^{-6}/°$ C. or less.

FIG. 18 is a graph illustrating the relationship between the surface roughness and the adhesiveness.

Figure 19:
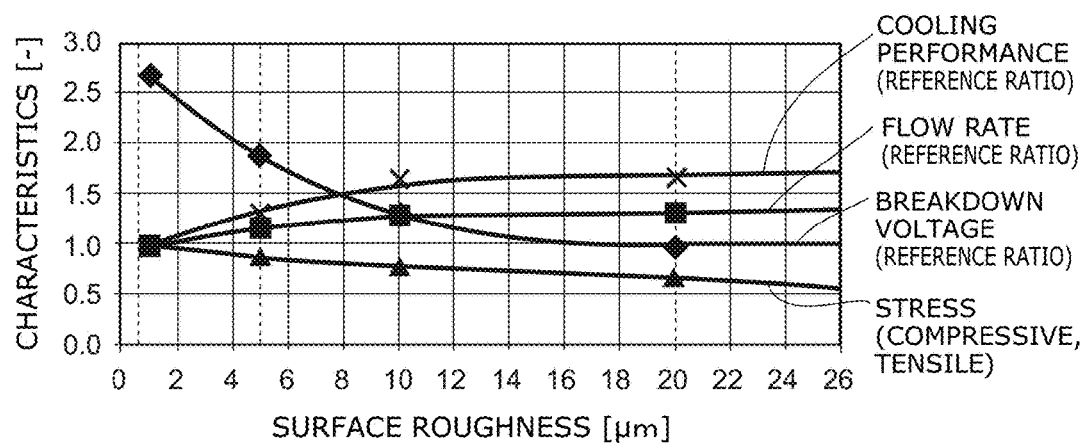
FIG. 19 is a graph illustrating the relationship between the surface roughness and each of the breakdown voltage, flow rate, stress, and cooling performance.

FIG. 19 is a graph illustrating the relationship between the surface roughness and each of the breakdown voltage, flow rate, stress, and cooling performance.

As shown in FIG. 18, the adhesiveness increases with the increase of the surface roughness by the anchor effect. That is, there is a correlation between the surface roughness and the adhesiveness. The graph of the correlation between the adhesiveness and each of the breakdown voltage, flow rate, stress, and cooling performance is as shown in FIG. 19.

In this specification, the "surface roughness" refers to the arithmetic average roughness Ra. The surface roughness is measured by a surface roughness meter based on JIS B 0601. The position for measuring the surface roughness of the ceramic porous body 71 is the central part in the Z-direction of the side surface of the ceramic porous body 71 (e.g., position P1 shown in FIG. 3). The position for measuring the surface roughness of the ceramic insulating film 72 is the central part in the Z-direction of the side surface of the ceramic insulating film 72 (e.g., position P2 shown in FIG. 3).

As shown in FIG. 19, the flow rate (reference ratio) increases with the increase of the surface roughness. The cooling performance (reference ratio) increases with the increase of the surface roughness. When the surface roughness is larger than 4 μm, the breakdown voltage (reference ratio) is less than 2. When the breakdown voltage is less than or equal to the reference value, the insulation breakdown voltage is not improved. Thus, the surface roughness of the ceramic insulating film 72 is preferably 4 μm or less. On the other hand, the particle of the ceramic insulating film 72 contains air. Thus, when the surface roughness of the ceramic insulating film 72 is smaller than 0.5 μm, the surface finish processing requires excessive time, effort, and cost. Thus, the surface roughness of the ceramic insulating film 72 is preferably 0.5 μm or more. Accordingly, the surface roughness of the ceramic insulating film 72 is preferably 0.5 μm or more and 4 μm or less.

When the surface roughness is 5 μm or more, the increase in the flow rate of the transfer gas is large. Thus, the surface roughness of the ceramic porous body 71 is preferably 5 μm or more.

When the surface roughness is larger than 20 μm, the decrease of the stress (compressive and tensile) is large. Thus, the surface roughness of the ceramic porous body 71 is preferably 20 μm or less. Accordingly, the surface roughness of the ceramic porous body 71 is preferably 5 μm or more and 20 μm or less.

The surface roughness of the ceramic dielectric substrate 11 is 0.1 μm or more and 1 μm or less.

Other physical property values related to the ceramic dielectric substrate 11, the ceramic porous body 71, and the ceramic insulating film 72 include residual stress, hardness (Vickers hardness: HV), and Young's modulus.

The residual stress of the ceramic porous body 71 is 150 megapascals (MPa) or less. The hardness (HV) of the ceramic porous body 71 is 2 gigapascals (GPa) or more and 10 GPa or less. The Young's modulus of the ceramic porous body 71 is 50 GPa or more and 200 GPa or less.

The residual stress of the ceramic insulating film 72 is 1500 MPa or less. The hardness (HV) of the ceramic insulating film 72 is 0.1 GPa or more and 5 GPa or less. The Young's modulus of the ceramic insulating film 72 is 40 GPa or more and 100 GPa or less.

The residual stress of the ceramic dielectric substrate 11 is 700 MPa or less. The hardness (HV) of the ceramic dielectric substrate 11 is 5 GPa or more and 20 GPa or less. The Young's modulus of the ceramic dielectric substrate 11 is 150 GPa or more and 500 GPa or less.

Next, examples of the ceramic porous body 71 are described.

Figure 20:
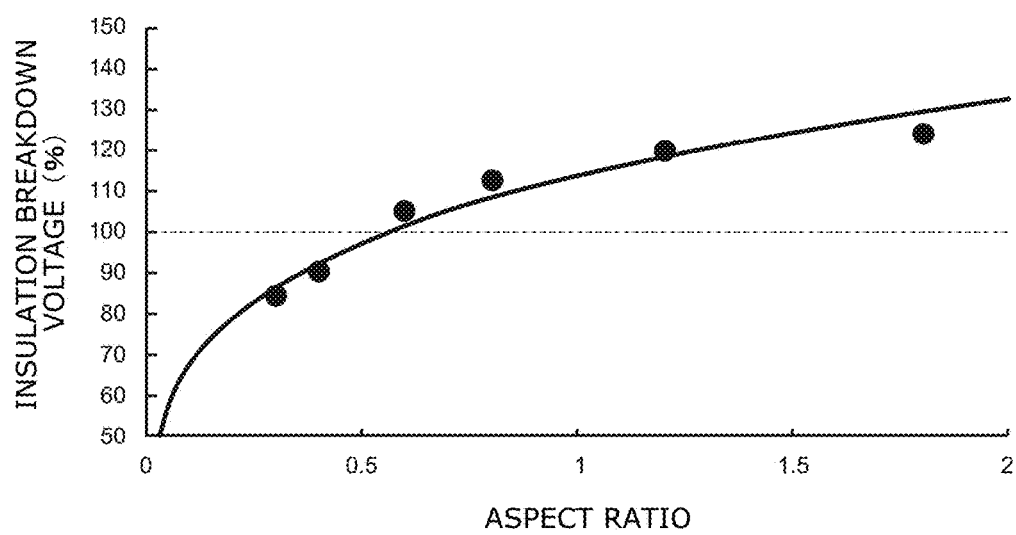
FIG. 20 is a graph illustrating the relationship between the aspect ratio and the insulation breakdown voltage.

FIG. 20 illustrates the relationship between the aspect ratio and the insulation breakdown voltage.

In FIG. 20, the horizontal axis represents the aspect ratio, and the vertical axis represents the insulation breakdown voltage (%). Here, the aspect ratio on the horizontal axis is the ratio of the length (length in the Z-direction) to the outer diameter of the ceramic porous body 71. The insulation breakdown voltage on the vertical axis being 100% represents the insulation breakdown voltage in the case where no insulator plug 70 is provided.

As shown in FIG. 20, when the aspect ratio is 0.6 or more, the insulation breakdown voltage exceeds 100%. Thus, the aspect ratio of the ceramic porous body 71 is preferably 0.6 or more.

Figure 21:
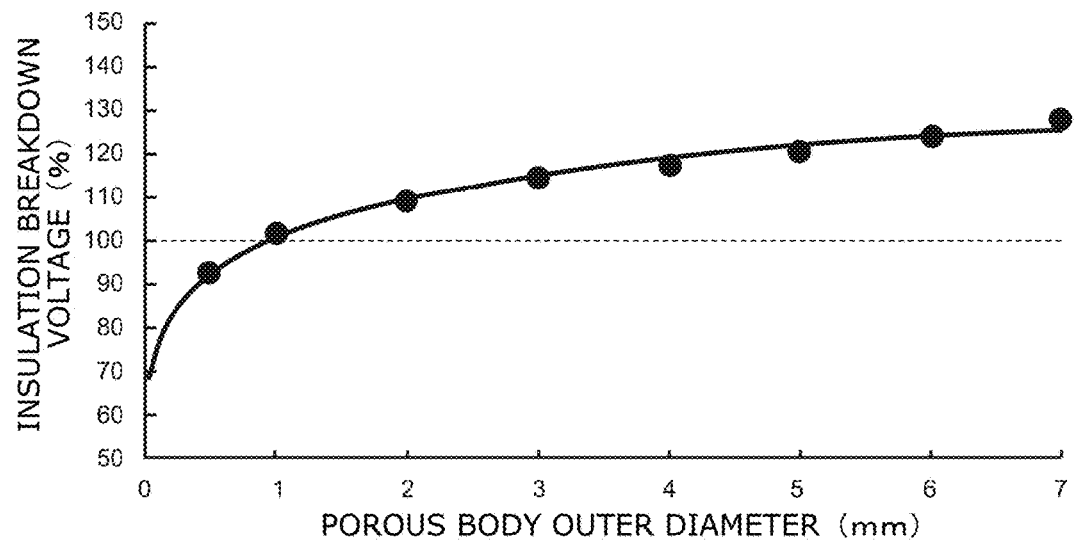
FIG. 21 illustrates the relationship between the outer diameter of the ceramic porous body and the insulation breakdown voltage.

FIG. 21 illustrates the relationship between the outer diameter of the ceramic porous body and the insulation breakdown voltage.

In FIG. 21, the horizontal axis represents the outer diameter (mm) of the ceramic porous body 71, and the vertical axis represents the insulation breakdown voltage (%). Here, the insulation breakdown voltage on the vertical axis being 100% represents the insulation breakdown voltage in the case where no insulator plug 70 is provided.

As shown in FIG. 21, when the outer diameter of the ceramic porous body 71 is 1 mm or more, the insulation breakdown voltage exceeds 100%. Thus, the outer diameter of the ceramic porous body 71 is preferably 1 mm or more. Furthermore, when the outer diameter of the ceramic porous body 71 is 1 mm or more, the temperature difference at the cold spot of the clamped target W (temperature difference between the position of the target W directly above the through hole 15 and its periphery) can be set to 1° C. or less.

Figure 22:
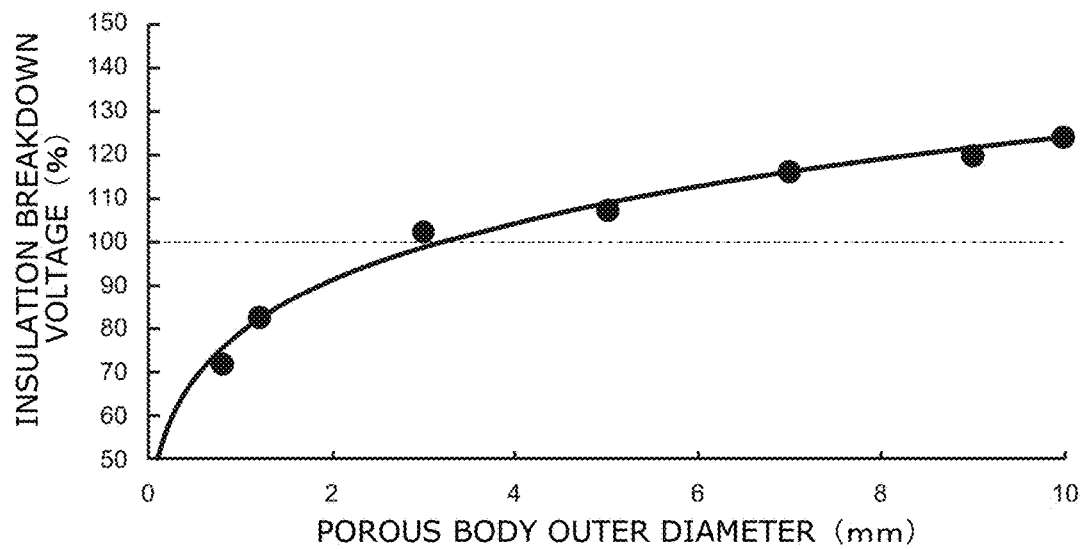
FIG. 22 illustrates the relationship between the length of the ceramic porous body and the insulation breakdown voltage.

FIG. 22 illustrates the relationship between the length of the ceramic porous body and the insulation breakdown voltage.

In FIG. 22, the horizontal axis represents the length (mm) of the ceramic porous body 71, and the vertical axis represents the insulation breakdown voltage (%). Here, the insulation breakdown voltage on the vertical axis being 100% represents the insulation breakdown voltage in the case where no insulator plug 70 is provided.

As shown in FIG. 22, when the length of the ceramic porous body 71 is 3 mm or more, the insulation breakdown voltage exceeds 100%. Thus, the length of the ceramic porous body 71 is preferably 3 mm or more.

Figure 23:
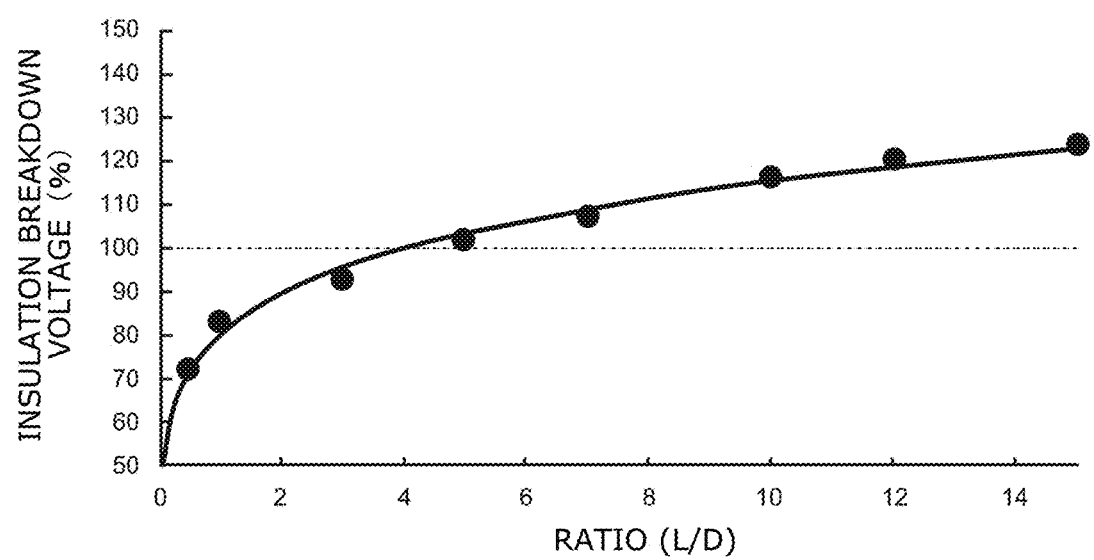
FIG. 23 illustrates the relationship between the ratio (L/D) of the ceramic porous body and the insulation breakdown voltage.

FIG. 23 illustrates the relationship between the ratio (L/D) of the ceramic porous body and the insulation breakdown voltage.

In FIG. 23, the horizontal axis represents the ratio (L/D) of the ceramic porous body 71, and the vertical axis represents the insulation breakdown voltage (%). Here, the ratio (L/D) on the horizontal axis is the ratio (L/D) in which the inner diameter of the through hole 15 is denoted by D, and the distance from the center of the through hole 15 to the outer periphery of the ceramic porous body 71 is denoted by L. The insulation breakdown voltage on the vertical axis being 100% represents the insulation breakdown voltage in the case where no insulator plug 70 is provided.

Here, the ratio (L/D) is described.

Figure 24A:
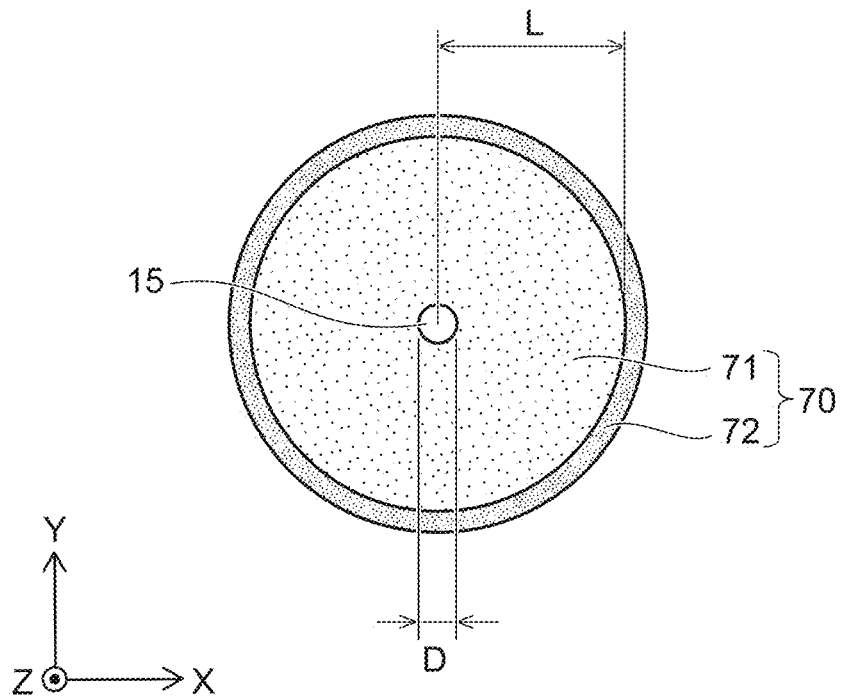
FIGS. 24A and 24B are schematic plan views illustrating the inner diameter D and the distance L.
Figure 24B:
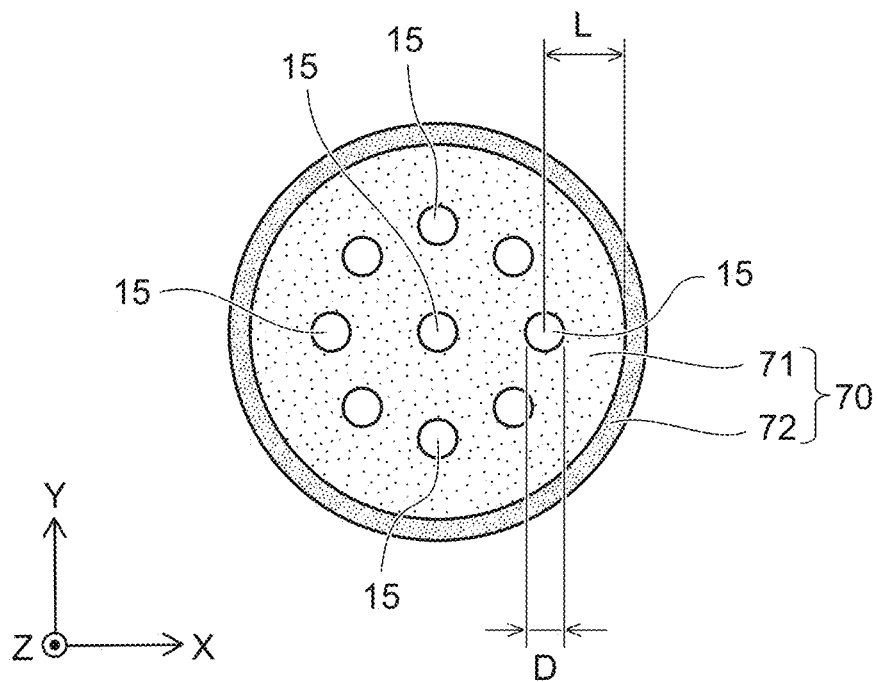

FIGS. 24A and 24B are schematic plan views illustrating the inner diameter D and the distance L.

FIGS. 24A and 24B show schematic plan views in which the through hole 15 and the insulator plug 70 are viewed in the Z-direction.

FIG. 24A shows an example in which one through hole 15 is placed on one insulator plug 70. In this example, the center of the through hole 15 coincides with the center of the insulator plug 70. In the case of one through hole 15, the inner diameter of this through hole 15 is denoted by D. The distance from the center of this through hole 15 to the outer periphery of the ceramic porous body 71 is denoted by L. In the case where the center of the through hole 15 does not coincide with the center of the insulator plug 70, the shortest distance from the center of the through hole 15 to the outer periphery of the ceramic porous body 71 is denoted by L.

FIG. 24B shows an example in which a plurality of through holes 15 are placed on one insulator plug 70. In this case, the inner diameter of one of the plurality of through holes 15 nearest to the outer periphery of the ceramic porous body 71 is denoted by D. The distance from the center of this through hole 15 to the outer periphery of the ceramic porous body 71 is denoted by L.

As shown in FIG. 23, when the ratio (L/D) of the ceramic porous body 71 is 5 or more, the insulation breakdown voltage exceeds 100%. Thus, the ratio (L/D) of the ceramic porous body 71 is preferably 5 or more.

Regarding the preferable conditions of the ceramic porous body 71 shown in FIGS. 20 to 23, it is only necessary to satisfy at least one of FIGS. 20 to 23. It is more preferable to satisfy two or more of FIGS. 20 to 23. It is most preferable to satisfy all of FIGS. 20 to 23.

Next, the relationship between the supply of the transfer gas and the temperature change of the target is described.

FIGS. 25A to 25D illustrate the temperature change of the clamped target.

FIGS. 25A to 25D show the temperature change of the target in the case of using He gas as the transfer gas.

Figure 25A:
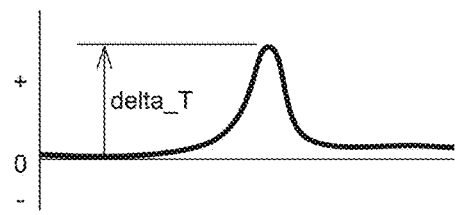
FIGS. 25A to 25D illustrate the temperature change of the clamped target.
Figure 25B:
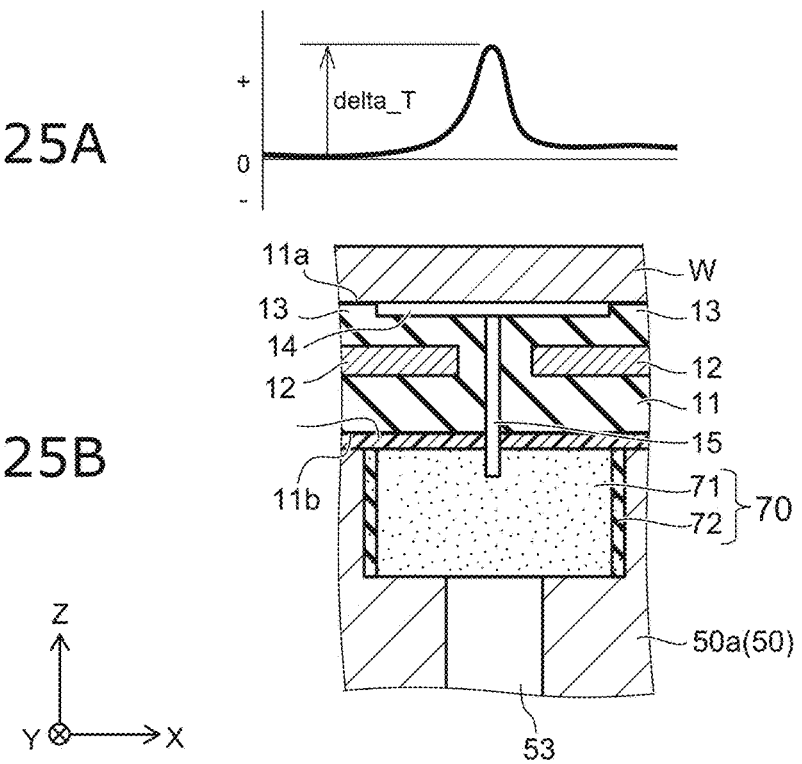

FIGS. 25A and 25B show the state in which He gas is not released from the through hole 15. FIG. 25B is a schematic sectional view showing the state in which the target W is clamped on the ceramic dielectric substrate 11. FIG. 25A is a schematic diagram illustrating the temperature distribution of the target W. In FIG. 25A, the horizontal axis represents the position of the target W. The vertical axis represents the temperature difference (delta_T) between the position directly above the through hole 15 and its periphery.

As shown in FIGS. 25A and 25B, when He gas is not released from the through hole 15, the temperature of the target W directly above the through hole 15 is made higher than the temperature of its periphery. The portion of the ceramic porous body 71 has a lower heat transfer coefficient than the portion of the metallic base plate 50. Thus, when He gas is not released, the temperature decreases more easily in the portion on the metallic base plate 50, but the temperature decreases less easily in the portion on the ceramic porous body 71, particularly directly above the through hole 15. Accordingly, the temperature of the portion of the target W directly above the through hole 15 is made higher than the temperature of the portion on the metallic base plate 50.

As shown in FIGS. 25A and 25B, when the temperature of the target W directly above the through hole 15 is higher than the temperature of the periphery of the position directly above the through hole 15, the temperature difference (delta_T) is positive (+).

Figure 25C:
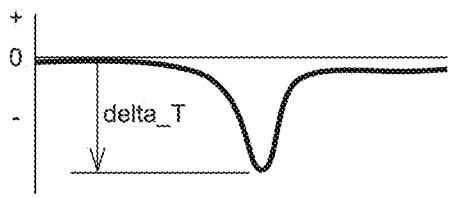
Figure 25D:
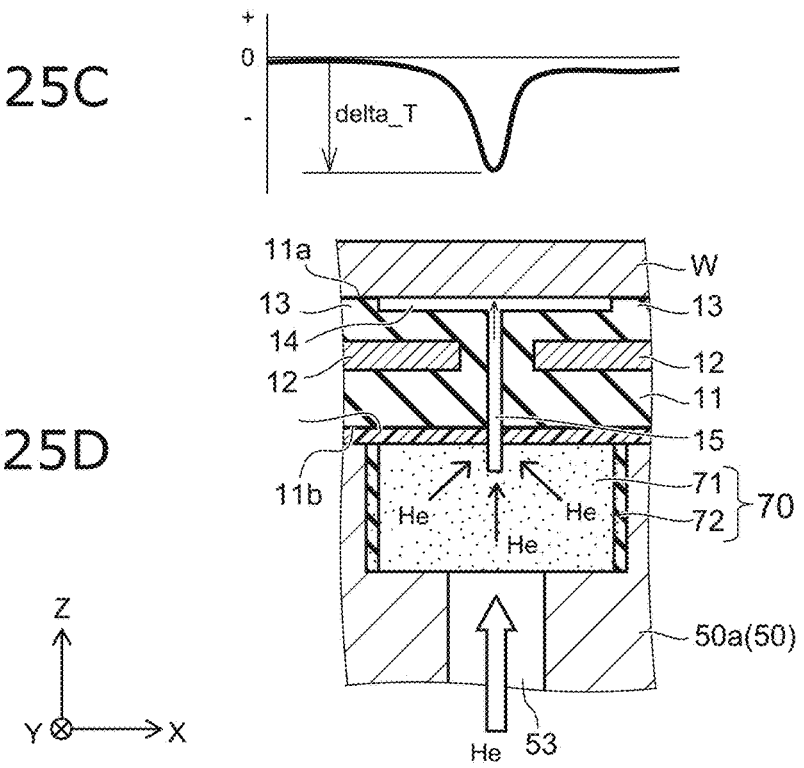

FIGS. 25C and 25D show the state in which He gas is released from the through hole 15. FIG. 25D is a schematic sectional view showing the state in which the target W is clamped on the ceramic dielectric substrate 11. FIG. 25C is a schematic diagram illustrating the temperature distribution of the target W. In FIG. 25C, the horizontal axis represents the position of the target W. The vertical axis represents the temperature difference (delta_T) between the position directly above the through hole 15 and its periphery.

Here, as shown in FIG. 25D, when He gas is fed from the gas feed channel 53, the He gas is carried from the gas feed channel 53 through the pores of the ceramic porous body 71 to the through hole 15. The He gas is carried through the through hole 15 into the groove 14 below the target W. The temperature of the target W is decreased by contact with the He gas.

As shown in FIGS. 25C and 25D, when He gas is released from the through hole 15, the temperature of the target W directly above the through hole 15 is made lower than the temperature of its periphery. The portion of the ceramic porous body 71 has a lower heat transfer coefficient than the portion of the metallic base plate 50. Thus, when He gas is released, the temperature decreases in the portion on the ceramic porous body 71, particularly directly above the through hole 15. This easily maintains the state having a lower temperature than the portion on the metallic base plate 50. Accordingly, the temperature of the portion of the target W directly above the through hole 15 is made lower than the temperature of the portion on the metallic base plate 50.

As shown in FIGS. 25C and 25D, when the temperature of the target W directly above the through hole 15 is lower than the temperature of the periphery of the position directly above the through hole 15, the temperature difference (delta_T) is negative (−).

Here, the timing of feeding the transfer gas such as He gas is described in the case of clamping the target W by the electrostatic chuck 110.

First, the target W is clamped on the first major surface 11a of the ceramic dielectric substrate 11. The transfer gas is not fed when clamping the target W. The control section 90 performs control so as not to feed the transfer gas.

When the target W is clamped on the ceramic dielectric substrate 11, the lower surface of the target W is brought into contact with a seal ring part 16 provided at the rim of the ceramic dielectric substrate 11 by the clamping force of the electrostatic chuck 110. A space partitioned by dots 13 is formed between the lower surface of the target W and the groove 14.

After clamping the target W, the transfer gas is fed. The control section 90 controls the pressure difference and flow rate of the transfer gas. The transfer gas is fed into the gas feed channel 53 at a prescribed pressure difference by the control of the control section 90. The transfer gas is carried from the gas feed channel 53 through the ceramic porous body 71 and the through hole 15 into the groove 14.

The groove 14 is filled with a prescribed amount of the transfer gas. Then, the space between the target W and the ceramic dielectric substrate 11 is filled with a prescribed amount of the transfer gas. While the target W is clamped, the transfer gas is replenished by the amount of leaking out of the gap between the target W and the seal ring part 16. The transfer gas filling the groove 14 can decrease the temperature of the target W by contact with the target W.

Then, the control section 90 stops supplying the transfer gas at the timing of deactivating the clamping of the target W. The transfer gas is released from the space between the target W and the ceramic dielectric substrate 11. Then, the target W is detached from the ceramic dielectric substrate 11.

In the actual process, the target W is transported. This can shorten the time (throughput) before processing the next target W.

In such timing of feeding the transfer gas, at the stage immediately after clamping the target W and before feeding the transfer gas, the temperature distribution of the target W is as shown in FIG. 25A. On the other hand, at the stage after clamping the target W and after feeding the transfer gas, the temperature distribution of the target W is as shown in FIG. 25C.

Figure 26:
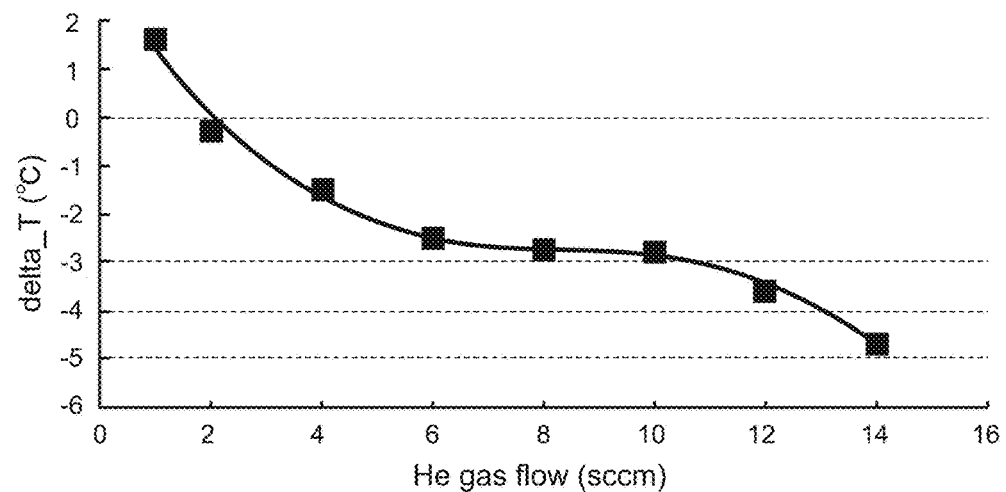
FIG. 26 illustrates the relationship between the gas flow rate and the temperature change.

FIG. 26 illustrates the relationship between the gas flow rate and the temperature change.

In FIG. 26, the horizontal axis represents the flow rate (sccm: standard cubic centimeter per minute) of He gas released from one through hole 15. The vertical axis represents the temperature difference delta_T (° C.) of the target W. Here, the pressure difference of the supplied He gas is 30 Torr. The temperature difference delta_T decreases with the increase of the flow rate of He gas released from one through hole 15.

In the electrostatic chuck 110 according to this embodiment, the lower limit of the flow rate of He gas released from one through hole 15 is 0.5 sccm. On the other hand, if the flow rate of He gas released from one through hole 15 is too high, the temperature difference delta_T decreases excessively. Then, uniformization of the temperature distribution is difficult. The absolute value of the temperature difference delta_T is preferably 5° C. or less so that the temperature distribution of the target W is made uniform. Thus, the flow rate of He gas released from one through hole 15 is desirably 14 sccm or less, preferably 12 sccm or less, and more preferably 10 sccm or less.

When the flow rate of He gas released from one through hole 15 is 14 sccm or less, the absolute value of the temperature difference delta_T is 5° C. or less. When the flow rate of He gas released from one through hole 15 is 12 sccm or less, the absolute value of the temperature difference delta_T is 4° C. or less. When the flow rate of He gas released from one through hole 15 is 10 sccm or less, the absolute value of the temperature difference delta_T is 3° C. or less.

Figure 27:
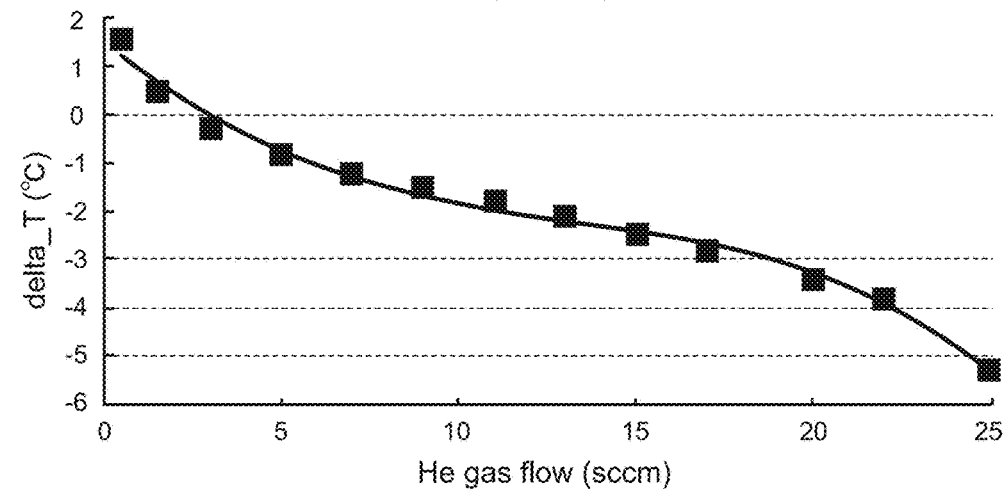
FIG. 27 illustrates the relationship between the gas flow rate and the temperature change.

FIG. 27 illustrates the relationship between the gas flow rate and the temperature change.

In FIG. 27, the horizontal axis represents the flow rate (sccm) of He gas released from one ceramic porous body 71. The vertical axis represents the temperature difference delta_T (° C.) of the target W. Here, the pressure difference of the supplied He gas is 30 Torr. The temperature difference delta_T decreases with the increase of the flow rate of He gas released from one ceramic porous body 71.

In the electrostatic chuck 110 according to this embodiment, the lower limit of the flow rate of He gas released from one ceramic porous body 71 is 3 sccm. This is the lower limit of the flow rate for cooling the target W (delta_T being less than 0° C.) by the flow of He gas. On the other hand, if the flow rate of He gas released from one ceramic porous body 71 is too high, the temperature difference delta_T decreases excessively. Then, uniformization of the temperature distribution is difficult. The absolute value of the temperature difference delta_T is preferably 5° C. or less so that the temperature distribution of the target W is made uniform. Thus, the flow rate of He gas released from one ceramic porous body 71 is desirably 24 sccm or less, preferably 22 sccm or less, and more preferably 17 sccm or less.

When the flow rate of He gas released from one ceramic porous body 71 is 24 sccm or less, the absolute value of the temperature difference delta_T is 5° C. or less. When the flow rate of He gas released from one ceramic porous body 71 is 22 sccm or less, the absolute value of the temperature difference delta_T is 4° C. or less. When the flow rate of He gas released from one ceramic porous body 71 is 17 sccm or less, the absolute value of the temperature difference delta_T is 3° C. or less.

Figure 28:
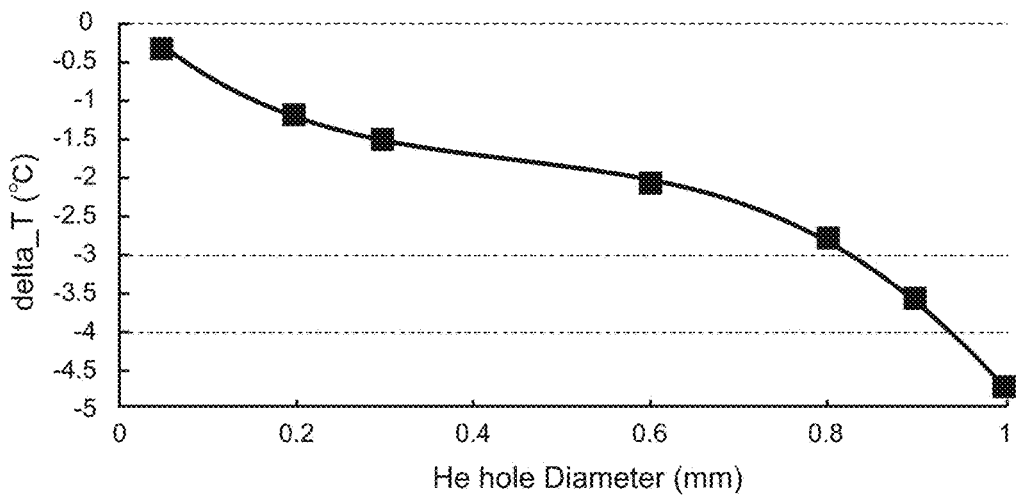
FIG. 28 illustrates the relationship between the inner diameter of the through hole and the temperature change.

FIG. 28 illustrates the relationship between the inner diameter of the through hole and the temperature change.

In FIG. 28, the horizontal axis represents the inner diameter (mm) of one through hole 15. The vertical axis represents the temperature difference delta_T (° C.) of the target W. Here, the pressure difference of the supplied He gas is 30 Torr. The temperature difference delta_T decreases with the increase of the inner diameter of one through hole 15.

In the electrostatic chuck 110 according to this embodiment, the lower limit of the inner diameter capable of forming one through hole 15 is 0.05 mm. On the other hand, if the inner diameter of one through hole 15 is too large, the temperature difference delta_T decreases excessively. Then, uniformization of the temperature distribution is difficult. The absolute value of the temperature difference delta_T is preferably 5° C. or less so that the temperature distribution of the target W is made uniform. Thus, the inner diameter of one through hole 15 is desirably 1 mm or less, preferably 0.9 mm or less, and more preferably 0.8 mm or less.

When the inner diameter of one through hole 15 is 1 mm or less, the absolute value of the temperature difference delta_T is 5° C. or less. When the inner diameter of one through hole 15 is 0.9 mm or less, the absolute value of the temperature difference delta_T is 4° C. or less. When the inner diameter of one through hole 15 is 0.8 mm or less, the absolute value of the temperature difference delta_T is 3° C. or less.

In the electrostatic chuck 110 according to this embodiment, one ceramic porous body 71 may be provided in a cylindrical shape. In this case, the outer diameter of the ceramic porous body 71 is desirably 7 mm or less. When the outer diameter of the ceramic porous body 71 is 7 mm or less, the absolute value of the temperature difference delta_T is 5° C. or less. When the outer diameter of the ceramic porous body 71 is 6 mm or less, the absolute value of the temperature difference delta_T is 4° C. or less. Furthermore, when the outer diameter of the ceramic porous body 71 is 5 mm or less, the absolute value of the temperature difference delta_T is 3° C. or less.

As described above, this embodiment can enhance the insulation breakdown voltage in the through hole 15 for feeding the transfer gas provided in the ceramic dielectric substrate 11 and in the gas feed channel 53 provided in the base plate 50. Thus, this embodiment can provide an electrostatic chuck 110 having high reliability.

Furthermore, this embodiment can provide an electrostatic chuck 110 capable of performing temperature control with high uniformity on the clamped target W even in the structure in which a ceramic porous body 71 is provided in the gas feed channel 53.

The embodiments of the invention have been described above. However, the invention is not limited to the above description. For instance, the electrostatic chuck 110 has been illustrated with reference to the configuration based on the Coulomb force. However, the electrostatic chuck 110 is also applicable to the configuration based on the Johnsen-Rahbek force. Those skilled in the art can appropriately modify the above embodiments, and such modifications are also encompassed within the scope of the invention as long as they include the features of the invention. Furthermore, various components in the above embodiments can be combined with each other as long as technically feasible. Such combinations are also encompassed within the scope of the invention as long as they include the features of the invention.

According to the aspects of the invention, there is provided an electrostatic chuck capable of achieving high insulation breakdown voltage against discharge in the gas feed channel, or an electrostatic chuck capable of performing temperature control with high wafer temperature uniformity on the clamped target even in the structure in which a ceramic porous body is provided in the gas feed channel.

REFERENCE SIGNS LIST 11 ceramic dielectric substrate
11a first major surface
11b second major surface
12 electrode
13 dot
14 groove
15 through hole
16 seal ring part
20 connection part
50 base plate
50a upper part
50b lower part
51 input channel
52 output channel
53 gas feed channel
53a counterbore part
55 communication channel
60 bonding member
70 insulator plug
71 ceramic porous body
72, 73 ceramic insulating film
75 boundary line
80 clamping voltage
90 control section
110, 110a electrostatic chuck

The invention claimed is:

1. An electrostatic chuck comprising:
a ceramic dielectric substrate including a first major surface for mounting a clamped target, a second major surface on opposite side from the first major surface, and a through hole extending through the ceramic dielectric substrate from the second major surface to the first major surface;
a metallic base plate supporting the ceramic dielectric substrate and including a gas feed channel communicating with the through hole, the base plate having a hollow socket formed therein in communication with the gas feed channel; and
an insulator plug including a ceramic porous body provided in the gas feed channel, the insulator plug disposed in the socket of the base plate below, contacting and substantially covered by the ceramic dielectric substrate, and a ceramic insulating film provided between side portions of the ceramic porous body and the hollow socket of the base plate, the ceramic insulating film having a high insulation performance and being denser than the ceramic porous body, the ceramic insulating film biting into the ceramic porous body from a surface of the ceramic porous body,
wherein the insulator plug is not exposed to an ambient environment outside of the ceramic dielectric substrate.

2. The chuck according to claim 1, wherein thermal expansion coefficient of the ceramic insulating film is equal to each of thermal expansion coefficient of the ceramic porous body and thermal expansion coefficient of the ceramic dielectric substrate.

3. The chuck according to claim 1, wherein arithmetic average roughness of a surface of the ceramic insulating film is smaller than arithmetic average roughness of the surface of the ceramic porous body and larger than arithmetic average roughness of a surface of the ceramic dielectric substrate.

4. The chuck according to claim 3, wherein
the arithmetic average roughness of the surface of the ceramic insulating film is 0.5 micrometers or more and 4 micrometers or less, and
the arithmetic average roughness of the surface of the ceramic porous body is 5 micrometers or more and 20 micrometers or less.

5. The chuck according to claim 1, wherein
porosity of the ceramic insulating film is 10 percent or less, and
porosity of the ceramic porous body is 30 percent or more and 60 percent or less.

6. The chuck according to claim 1, wherein
density of the ceramic insulating film is 3.0 grams per cubic centimeter or more and 4.0 grams per cubic centimeter or less, and
density of the ceramic porous body is 1.5 grams per cubic centimeter or more and 3.0 grams per cubic centimeter or less.

7. The chuck according to claim 1, wherein ratio of difference between thermal expansion coefficient of the ceramic porous body and thermal of the ceramic insulating film with reference to the thermal expansion coefficient of the ceramic porous body is 100% or less.

8. The chuck according to claim 1, wherein thermal expansion coefficient of each of the ceramic porous body and the ceramic insulating film is $7.0 \times 10^{-6}/°$ C. or more and $10.0 \times 10^{-6}/°$ C. or less.

9. The chuck according to claim 1, wherein thermal conductivity of each of the ceramic porous body and the ceramic insulating film is 0.3 watts per meter kelvin or more and 10 watts per meter kelvin or less.

10. The chuck according to claim 1, wherein the ceramic insulating film is a ceramic sprayed film provided on a side surface of the ceramic porous body.

11. The chuck according to claim 1, wherein a ratio of length to outer diameter of the ceramic porous body is 0.6 or more.

12. The chuck according to claim 11, wherein the outer diameter of the ceramic porous body is 1 millimeter or more.

13. The chuck according to claim 11, wherein the length of the ceramic porous body is 3 millimeter or more.

14. The chuck according to claim 1, wherein L/D is 5 or more, where D is inner diameter of the through hole, and L is distance from center of the through hole to outer periphery of the ceramic porous body.

15. The chuck according to claim 1, wherein flow rate of He gas flowing out per the through hole is 0.5 sccm or more and 14 sccm or less when pressure difference of the He gas is 30 Torr.

16. The chuck according to claim 1, wherein flow rate of He gas flowing out per the ceramic porous body is 3 sccm or more and 24 sccm or less when pressure difference of the He gas is 30 Torr.

17. The chuck according to claim 1, wherein inner diameter of the through hole is 0.05 millimeters or more and 1 millimeter or less.

18. The chuck according to claim 1, wherein outer diameter of the ceramic porous body is 7 millimeters or less.

19. An electrostatic chuck comprising:
a ceramic dielectric substrate including a first major surface for mounting a clamped target, a second major surface on opposite side from the first major surface, and a through hole extending through the ceramic dielectric substrate from the second major surface to the first major surface;
a metallic base plate supporting the ceramic dielectric substrate and including a gas feed channel communicating with the through hole, the base plate having a hollow socket formed therein in communication with the gas feed channel; and
an insulator plug including a ceramic porous body provided in the gas feed channel, the insulator plug disposed in the socket of the base plate below, contacting and substantially covered by the ceramic dielectric substrate, and a ceramic insulating film provided between side portions of the ceramic porous body and the hollow socket of the base plate, the ceramic insulating film having a high insulation performance and being denser than the ceramic porous body, the ceramic insulating film biting into the ceramic porous body from a surface of the ceramic porous body,
wherein the ceramic dielectric substrate includes an electrode for clamping the target, and the insulator plug is provided below and spaced away from the electrode.

20. An electrostatic chuck comprising:
a ceramic dielectric substrate including a first major surface for mounting a clamped target, a second major surface on opposite side from the first major surface, and a through hole extending through the ceramic dielectric substrate from the second major surface to the first major surface;
a metallic base plate supporting the ceramic dielectric substrate and including a gas feed channel communicating with the through hole, the base plate having a hollow socket formed therein in communication with the gas feed channel; and
an insulator plug including a ceramic porous body provided in the gas feed channel, the insulator plug disposed in the socket of the base plate below, contacting and substantially covered by the ceramic dielectric substrate, and a ceramic insulating film provided between side portions of the ceramic porous body and the hollow socket of the base plate, the ceramic insulating film having a high insulation performance and being denser than the ceramic porous body, the ceramic insulating film biting into the ceramic porous body from a surface of the ceramic porous body,
wherein the gas feed channel has a face along a direction perpendicular to the second main surface of the ceramic dielectric substrate, and the insulator plug is provided at the face.

21. The electrostatic chuck according to claim 20, wherein the ceramic insulator film engages with the face.

* * * * *